(12) United States Patent
Felker et al.

(10) Patent No.: US 8,975,615 B2
(45) Date of Patent: Mar. 10, 2015

(54) METHOD OF FABRICATING OPTICAL DEVICES USING LASER TREATMENT OF CONTACT REGIONS OF GALLIUM AND NITROGEN CONTAINING MATERIAL

(75) Inventors: Andrew Felker, Livermore, CA (US); Nicholas A. Vickers, Hayward, CA (US); Rafael Aldaz, Pleasanton, CA (US); David Press, San Francisco, CA (US); Nicholas J. Pfister, Goleta, CA (US); James W. Raring, Goleta, CA (US); Mathew C. Schmidt, Goleta, CA (US); Kenneth John Thomson, San Francisco, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

(21) Appl. No.: 13/291,922

(22) Filed: Nov. 8, 2011

(65) Prior Publication Data

US 2012/0104359 A1    May 3, 2012

Related U.S. Application Data

(63) Continuation-in-part of application No. 12/942,817, filed on Nov. 9, 2010.

(51) Int. Cl.
*H01L 33/06* (2010.01)
*H01L 33/20* (2010.01)
(Continued)

(52) U.S. Cl.
CPC .............. *H01L 33/20* (2013.01); *B82Y 20/00* (2013.01); *H01S 5/0425* (2013.01); *H01S 5/2201* (2013.01); *H01S 5/3202* (2013.01);

*H01L 33/0095* (2013.01); *H01S 5/0202* (2013.01); *H01S 5/0217* (2013.01); *H01S 5/028* (2013.01);
(Continued)

(58) Field of Classification Search
CPC ... H01S 5/028; H01S 5/0421; H01S 5/34333; H01S 2304/04
USPC ........ 438/22, 29, 34, 42; 257/12–14, 79–103, 257/918, E51.018–E51.022, 257/E33.001–E33.077, E33.054, E25.028, 257/E25.032
See application file for complete search history.

(56) References Cited

U.S. PATENT DOCUMENTS 4,341,592 A    7/1982   Shortes et al.
4,860,687 A    8/1989   Frijlink
(Continued)

FOREIGN PATENT DOCUMENTS

CN    1781195       5/2006
CN    101079463     9/2009
(Continued)

OTHER PUBLICATIONS

U.S. Appl. No. 12/497,289, filed Jul. 2, 2009, Raring et al.
(Continued)

*Primary Examiner* — Nathan Ha
*Assistant Examiner* — Sue Tang
(74) *Attorney, Agent, or Firm* — Kilpatrick Townsend & Stockton LLP

(57) ABSTRACT

A method for forming optical devices includes providing a gallium nitride substrate having a crystalline surface region and a backside region. The backside is subjected to a laser scribing process to form scribe regions. Metal contacts overly the scribe regions.

21 Claims, 25 Drawing Sheets

(51) Int. Cl.

| | | |
|---|---|---|
| *B82Y 20/00* | (2011.01) | |
| *H01S 5/042* | (2006.01) | |
| *H01S 5/22* | (2006.01) | |
| *H01S 5/32* | (2006.01) | |
| *H01L 33/00* | (2010.01) | |
| *H01S 5/02* | (2006.01) | |
| *H01S 5/028* | (2006.01) | |
| *H01S 5/343* | (2006.01) | |

(52) U.S. Cl.
CPC ......... *H01S 5/34333* (2013.01); *H01S 2304/04* (2013.01); *H01L 2924/0002* (2013.01)
USPC .......................................................... 257/14

(56) References Cited

U.S. PATENT DOCUMENTS

| | | | |
|---|---|---|---|
| 4,915,745 A * | 4/1990 | Pollock et al. ................. | 136/265 |
| 5,334,277 A | 8/1994 | Nakamura | |
| 5,527,417 A | 6/1996 | Iida et al. | |
| 5,607,899 A | 3/1997 | Yoshida et al. | |
| 5,632,812 A | 5/1997 | Hirabayashi | |
| 5,696,389 A | 12/1997 | Ishikawa et al. | |
| 5,821,555 A | 10/1998 | Saito et al. | |
| 5,888,907 A | 3/1999 | Tomoyasu et al. | |
| 6,069,394 A | 5/2000 | Hashimoto et al. | |
| 6,147,953 A | 11/2000 | Duncan | |
| 6,153,010 A | 11/2000 | Kiyoku et al. | |
| 6,303,405 B1 * | 10/2001 | Yoshida et al. ................. | 438/46 |
| 6,379,985 B1 | 4/2002 | Cervantes et al. | |
| 6,451,157 B1 | 9/2002 | Hubacek | |
| 6,631,150 B1 | 10/2003 | Najda | |
| 6,680,959 B2 | 1/2004 | Tanabe et al. | |
| 6,734,461 B1 | 5/2004 | Shiomi et al. | |
| 6,755,932 B2 | 6/2004 | Masuda et al. | |
| 6,814,811 B2 | 11/2004 | Ose | |
| 6,833,564 B2 | 12/2004 | Shen et al. | |
| 6,858,081 B2 | 2/2005 | Biwa et al. | |
| 6,920,166 B2 | 7/2005 | Akasaka et al. | |
| 7,053,413 B2 | 5/2006 | D'Evelyn et al. | |
| 7,063,741 B2 | 6/2006 | D'Evelyn | |
| 7,220,324 B2 | 5/2007 | Baker et al. | |
| 7,303,630 B2 | 12/2007 | Motoki et al. | |
| 7,312,156 B2 | 12/2007 | Granneman et al. | |
| 7,323,723 B2 | 1/2008 | Ohtsuka et al. | |
| 7,338,828 B2 | 3/2008 | Imer et al. | |
| 7,390,359 B2 | 6/2008 | Miyanaga et al. | |
| 7,489,441 B2 | 2/2009 | Scheible et al. | |
| 7,555,025 B2 | 6/2009 | Yoshida | |
| 7,727,332 B2 | 6/2010 | Habel et al. | |
| 7,749,326 B2 | 7/2010 | Kim et al. | |
| 7,806,078 B2 | 10/2010 | Yoshida | |
| 7,968,864 B2 | 6/2011 | Akita et al. | |
| 8,017,932 B2 | 9/2011 | Okamoto et al. | |
| 2002/0050488 A1 | 5/2002 | Nikitin et al. | |
| 2002/0085603 A1 | 7/2002 | Okumura | |
| 2003/0000453 A1 | 1/2003 | Unno et al. | |
| 2003/0001238 A1 | 1/2003 | Ban | |
| 2003/0012243 A1 | 1/2003 | Okumura | |
| 2003/0020087 A1 | 1/2003 | Goto et al. | |
| 2003/0140846 A1 | 7/2003 | Biwa et al. | |
| 2003/0216011 A1 | 11/2003 | Nakamura et al. | |
| 2004/0025787 A1 | 2/2004 | Selbrede et al. | |
| 2004/0060518 A1 | 4/2004 | Nakamura et al. | |
| 2004/0113141 A1 * | 6/2004 | Isuda et al. ..................... | 257/13 |
| 2004/0151222 A1 | 8/2004 | Sekine | |
| 2004/0196877 A1 | 10/2004 | Kawakami et al. | |
| 2005/0040384 A1 | 2/2005 | Tanaka et al. | |
| 2005/0072986 A1 | 4/2005 | Sasaoka | |
| 2005/0168564 A1 | 8/2005 | Kawaguchi et al. | |
| 2005/0224826 A1 | 10/2005 | Keuper et al. | |
| 2005/0229855 A1 | 10/2005 | Raaijmakers | |
| 2005/0230701 A1 * | 10/2005 | Huang ............................ | 257/103 |
| 2006/0037529 A1 | 2/2006 | D'Evelyn | |
| 2006/0060131 A1 | 3/2006 | Atanackovic | |
| 2006/0078022 A1 | 4/2006 | Kozaki et al. | |
| 2006/0079082 A1 | 4/2006 | Bruhns et al. | |
| 2006/0086319 A1 | 4/2006 | Kasai et al. | |
| 2006/0118799 A1 | 6/2006 | D'Evelyn et al. | |
| 2006/0144334 A1 | 7/2006 | Yim et al. | |
| 2006/0189098 A1 | 8/2006 | Edmond | |
| 2006/0193359 A1 | 8/2006 | Kuramoto | |
| 2006/0216416 A1 | 9/2006 | Sumakeris et al. | |
| 2006/0256482 A1 | 11/2006 | Araki et al. | |
| 2007/0110112 A1 | 5/2007 | Sugiura | |
| 2007/0217462 A1 | 9/2007 | Yamasaki | |
| 2008/0087919 A1 | 4/2008 | Tysoe et al. | |
| 2008/0092812 A1 | 4/2008 | McDiarmid et al. | |
| 2008/0095492 A1 | 4/2008 | Son et al. | |
| 2008/0124817 A1 | 5/2008 | Bour et al. | |
| 2008/0164578 A1 | 7/2008 | Tanikella et al. | |
| 2008/0173735 A1 | 7/2008 | Mitrovic et al. | |
| 2008/0191223 A1 | 8/2008 | Nakamura et al. | |
| 2008/0217745 A1 | 9/2008 | Miyanaga et al. | |
| 2008/0232416 A1 | 9/2008 | Okamoto et al. | |
| 2008/0285609 A1 | 11/2008 | Ohta et al. | |
| 2008/0291961 A1 | 11/2008 | Kamikawa et al. | |
| 2008/0303033 A1 | 12/2008 | Brandes | |
| 2008/0315179 A1 | 12/2008 | Kim et al. | |
| 2009/0058532 A1 | 3/2009 | Kikkawa et al. | |
| 2009/0061857 A1 | 3/2009 | Kazmi | |
| 2009/0078944 A1 | 3/2009 | Kubota et al. | |
| 2009/0081857 A1 | 3/2009 | Hanser et al. | |
| 2009/0095973 A1 * | 4/2009 | Tanaka et al. ................... | 257/99 |
| 2009/0141765 A1 | 6/2009 | Kohda et al. | |
| 2009/0159869 A1 | 6/2009 | Ponce et al. | |
| 2009/0170224 A1 | 7/2009 | Urashima | |
| 2009/0229519 A1 | 9/2009 | Saitoh | |
| 2009/0250686 A1 | 10/2009 | Sato et al. | |
| 2009/0267100 A1 | 10/2009 | Miyake et al. | |
| 2009/0301387 A1 | 12/2009 | D'Evelyn | |
| 2009/0301388 A1 | 12/2009 | D'Evelyn | |
| 2009/0309110 A1 | 12/2009 | Raring et al. | |
| 2009/0309127 A1 | 12/2009 | Raring et al. | |
| 2009/0320744 A1 | 12/2009 | D'Evelyn | |
| 2010/0001300 A1 | 1/2010 | Raring et al. | |
| 2010/0003492 A1 | 1/2010 | D'Evelyn | |
| 2010/0025656 A1 | 2/2010 | Raring et al. | |
| 2010/0031875 A1 | 2/2010 | D'Evelyn | |
| 2010/0096615 A1 | 4/2010 | Okamoto et al. | |
| 2010/0140745 A1 | 6/2010 | Khan et al. | |
| 2010/0151194 A1 | 6/2010 | D'Evelyn | |
| 2010/0276663 A1 * | 11/2010 | Enya et al. ....................... | 257/13 |
| 2010/0295054 A1 | 11/2010 | Okamoto et al. | |
| 2010/0316075 A1 | 12/2010 | Raring et al. | |
| 2011/0031508 A1 * | 2/2011 | Hamaguchi et al. ............ | 257/79 |
| 2011/0057167 A1 | 3/2011 | Ueno et al. | |
| 2011/0064100 A1 | 3/2011 | Raring et al. | |
| 2011/0064101 A1 | 3/2011 | Raring et al. | |
| 2011/0064102 A1 | 3/2011 | Raring et al. | |
| 2011/0103418 A1 | 5/2011 | Hardy et al. | |
| 2011/0186874 A1 | 8/2011 | Shum | |
| 2011/0186887 A1 | 8/2011 | Trottier et al. | |

FOREIGN PATENT DOCUMENTS

| | | |
|---|---|---|
| JP | 2007-173467 A | 7/2007 |
| WO | WO 2004/084275 | 9/2004 |

OTHER PUBLICATIONS

Abare "Cleaved and Etched Facet Nitride Laser Diodes," IEEE Journal of Selected Topics in Quantum Electronics, vol. 4, No. 3, pp. 505-509 (May 1998).

Aoki et al., "InGaAs/InGaAsP MQW Electroabsorption Modulator Integrated with a DFB Laser Fabricated by Band-Gap Energy Control Selective Area MOCVD, 1993, "IEEE J Quantum Electronics, vol. 29, pp. 2088-2096.

Asano et al., "100-mW kink-Free Blue-Violet Laser Diodes with Low Aspect Ratio," 2003, IEEE Journal of Quantum Electronics, vol. 39, No. 1, pp. 135-140.

Asif Khan "Cleaved cavity optically pumped InGaN—GaN laser grown on spinel substrates," Appl. Phys. Lett. 69 (16), pp. 2418-2420 (Oct. 14, 1996).

(56) References Cited

OTHER PUBLICATIONS

Bernardini et al., "Spontaneous Polarization and Piezoelectric Constants of III-V Nitrides," 1997, Physical Review B, vol. 56, No. 16, pp. 10024-10027.
Caneau et al., "Studies on Selective OMVPE of (Ga,In)/(As,P)," 1992, Journal of Crystal Growth, vol. 124, pp. 243-248.
Chen et al., "Growth and Optical Properties of Highly Uniform and Periodic InGaN Nanostructures," 2007, Advanced Materials, vol. 19, pp. 1707-1710.
D'Evelyn et al., "Bulk GaN Crystal Growth by the High-Pressure Ammonothermal Method," Journal of Crystal Growth, 2007, vol. 300, pp. 11-16.
Fujii et al., "Increase in the Extraction Efficiency of GaN-based Light-Emitting Diodes Via Surface Roughening," 2004, Applied Physics Letters, vol. 84, No. 6, pp. 855-857.
Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.
Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.
Gardner et al. "Blue-emitting InGaN-GaN double-heterostructure light-emitting diodes reaching maximum quantum efficiency above 200 A/ cm2", Applied Physics Letters 91, 243506 (2007).
hap ://techon.nikkeibp. co jp/english/NEWS_EN/20080122/146009.
Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kendall et al., "Energy Savings Potential of Solid State Lighting in General Lighting Applications," 2001, Report for the Department of Energy, pp. 1-35.
Kim et al, "Improved Electroluminescence on Nonpolar m-plane InGaN/GaN Qantum Well LEDs", 2007, Physica Status Solidi (RRL), vol. 1, No. 3, pp. 125-127.
Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.
Lin et al."Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).
Masui et al. "Electrical Characteristics of Nonpolar InGaN-Based Light-Emitting Diodes Evaluated at Low Temperature," Jpn. J. Appl. Phys. 46 pp. 7309-7310 (2007).
Michiue et al. "Recent development of nitride LEDs and LDs," Proceedings of SPIE, vol. 7216, 72161Z (2009).
Nakamura et al., "InGaN/Gan/AIGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.
Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.
Okamoto et al. In "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).
Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.
Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.
Park, "Crystal orientation effects on electronic properties of wurtzite InGaN/GaN quantum wells,",Journal of Applied Physics vol. 91, No. 12, pp. 9904-9908 (Jun. 2002).
Purvis, "Changing the Crystal Face of Gallium Nitride." The Advance Semiconductor Magazine, vol. 18, No. 8, Nov. 2005.
Romanov "Strain-induced polarization in wurtzite III-nitride semipolar layers," Journal of Applied Physics 100, pp. 023522-1 through 023522-10 (Jul. 25, 2006).
Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-plane InGaN/GaN Laser Diodes," 2007, Journal of Japanese Applied Physics, vol. 46, No. 9, pp. 190-191.
Schmidt et al., "High Power and High External Efficiency m-plane InGaN Light Emitting Diodes," 2007, Japanese Journal of Applied Physics, vol. 46, No. 7, pp. L126-L128.
Schoedl "Facet degradation of GaN heterostructure laser diodes," Journal of Applied Physics vol. 97, issue 12, pp. 123102-1 to 123102-8 (2005).
Shchekin et al., "High Performance Thin-film Flip-Chip InGaN—GaN Light-emitting Diodes," 2006, Applied Physics Letters, vol. 89, pp. 071109-071109-3.
Shen et al. "Auger recombination in InGaN measured by photoluminescence," Applied Physics Letters, 91, 141101 (2007).
Sizov et al., "500-nm Optical Gain Anisotropy of Semipolar (1122) InGaN Quantum Wells," 2009, Applied Physics Express, vol. 2, pp. 071001-1-071001-3.
Tomiya et. al. Dislocation related issues in the degradation of GaN-based laser diodes, IEEE Journal of Selected Topics in Quantum Electronics vol. 10, No. 6 (2004).
Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.
Uchida et al.,"Recent Progress in High-Power Blue-violet Lasers," 2003, IEEE Journal of Selected Topics in Quantum Electronics, vol. 9, No. 5, pp. 1252-1259.
Waltereit et al., "Nitride Semiconductors Free of Electrostatic Fields for Efficient White Light-emitting Diodes," 2000, Nature: International Weekly Journal of Science, vol. 406, pp. 865-868.
Wierer et al., "High-power AlGaInN Flip-chip Light-emitting Diodes," 2001, Applied Physics Letters, vol. 78, No. 22, pp. 3379-3381.
Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.
Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.
Feezell et al. 'Development of nonpolar and semipolar InGaN/GaN visible light-emitting diodes', MRS Bulletin, vol. 34, May 2009, pp. 318-323.
International Search Report of PCT Application No. PCT/US2010/030939, dated Jun. 16, 2010, 9 pages total.
Communication from the Chinese Patent Office re 200980134723.8 dated Jun. 27, 2013, 19 pages.

(56) References Cited

OTHER PUBLICATIONS

USPTO Notice of Allowance for U.S. Appl. No. 12/868,441 dated Sep. 18, 2013, 13 pages.
USPTO Office Action for U.S. Appl. No. 13/114,806 dated Aug. 26, 2013, 22 pages.
Final Office Action of Jan. 2, 2014 for U.S. Appl. No. 12/942,817, 15 pages.
Non-Final Office Action of Jul. 31, 2014 for U.S. Appl. No. 12/942,817, 12 pages.
Final Office Action of Oct. 22, 2014 for U.S. Appl. No. 12/942,817, 12 pages.

* cited by examiner

Figure 1: c-direction laser diode on nonpolar substrate with cleaved mirror

Figure 3: Mirrors/Polarization/Gain

- c-direction cleaved facets
  - Smooth and vertical = great mirror
- Must orient lasers in c-direction
  - For max gain, light polarization must be perp. to laser stripe
- Off-axis orientations to increase polarization/gain

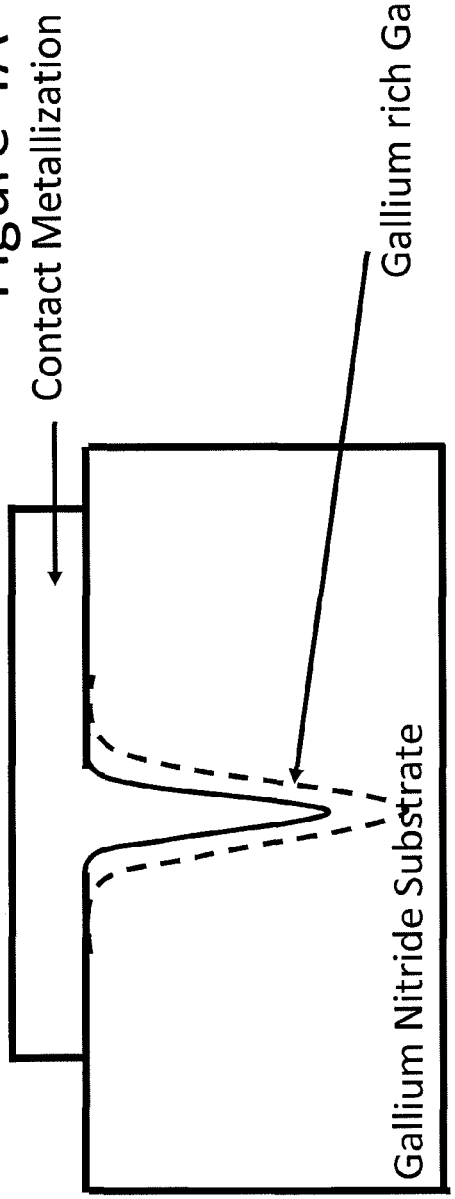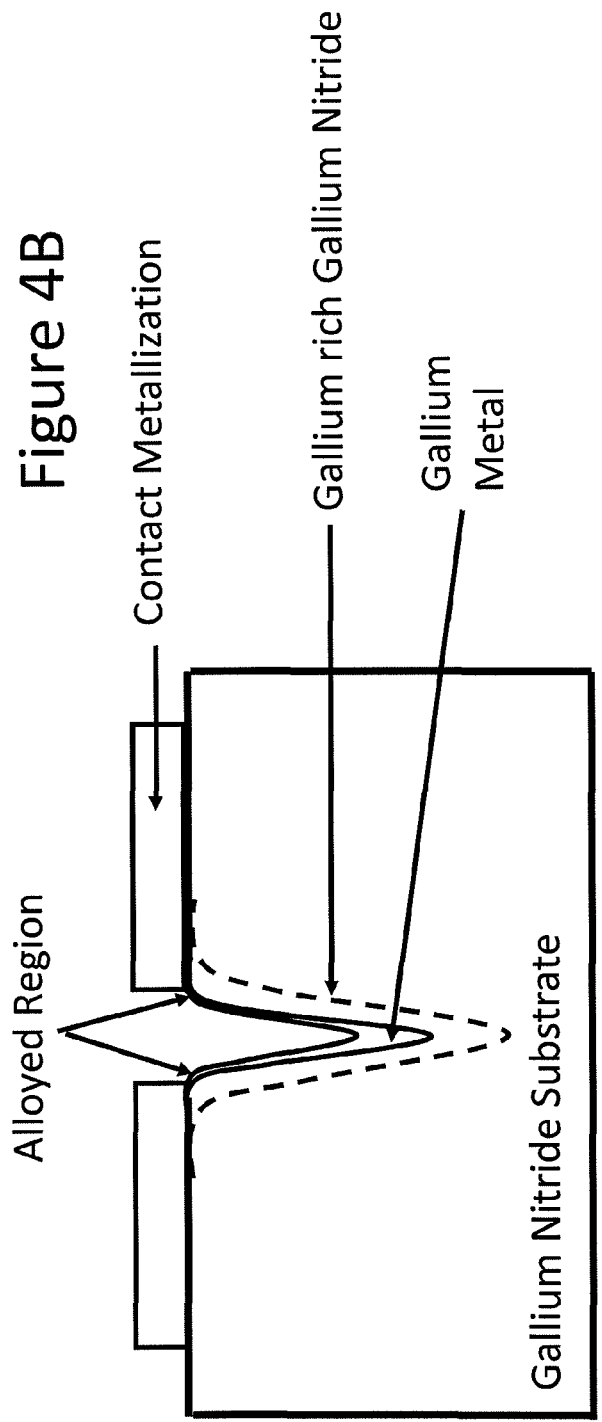

Laser device contact scribe
Blanket metallization of scribed regions

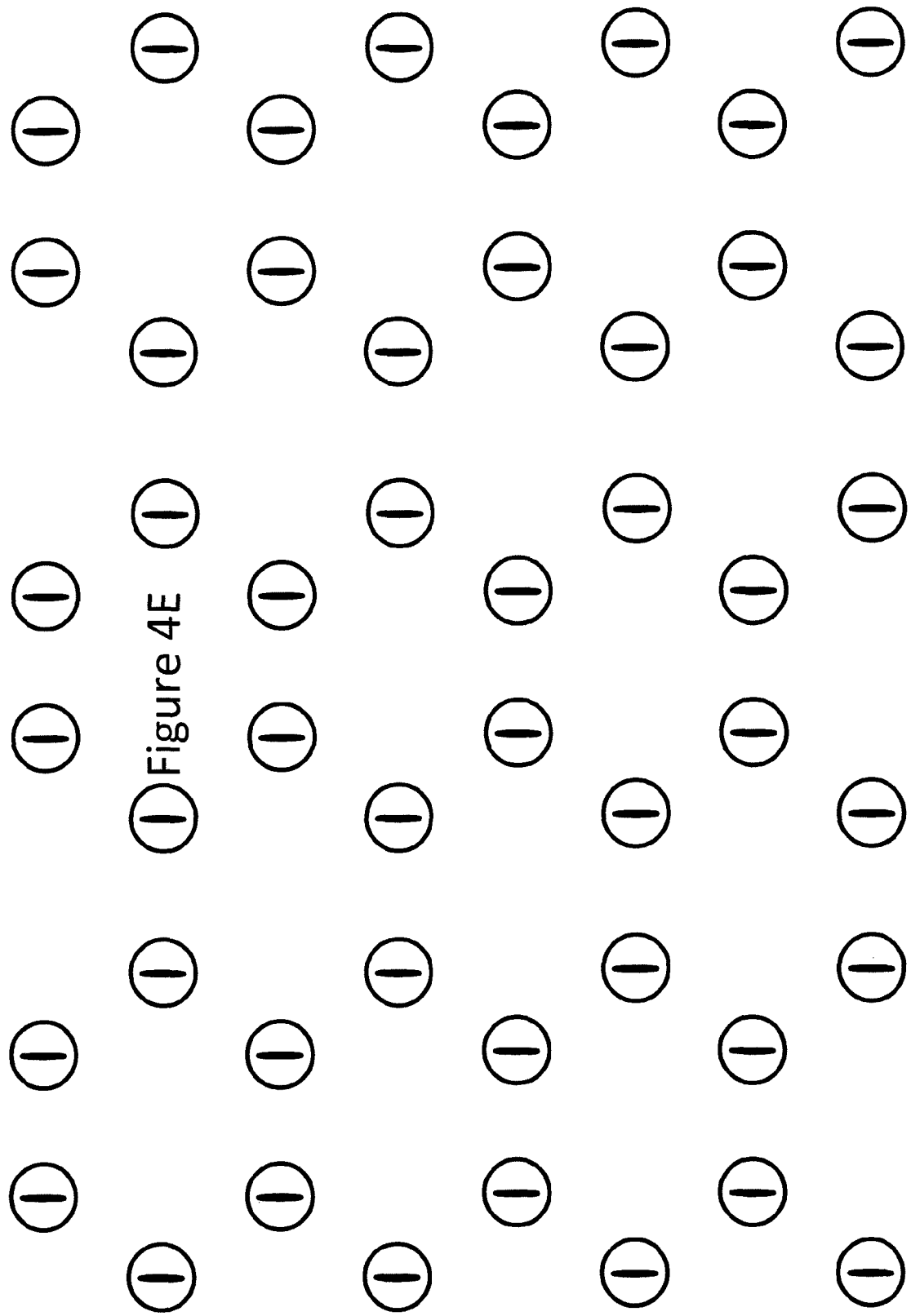

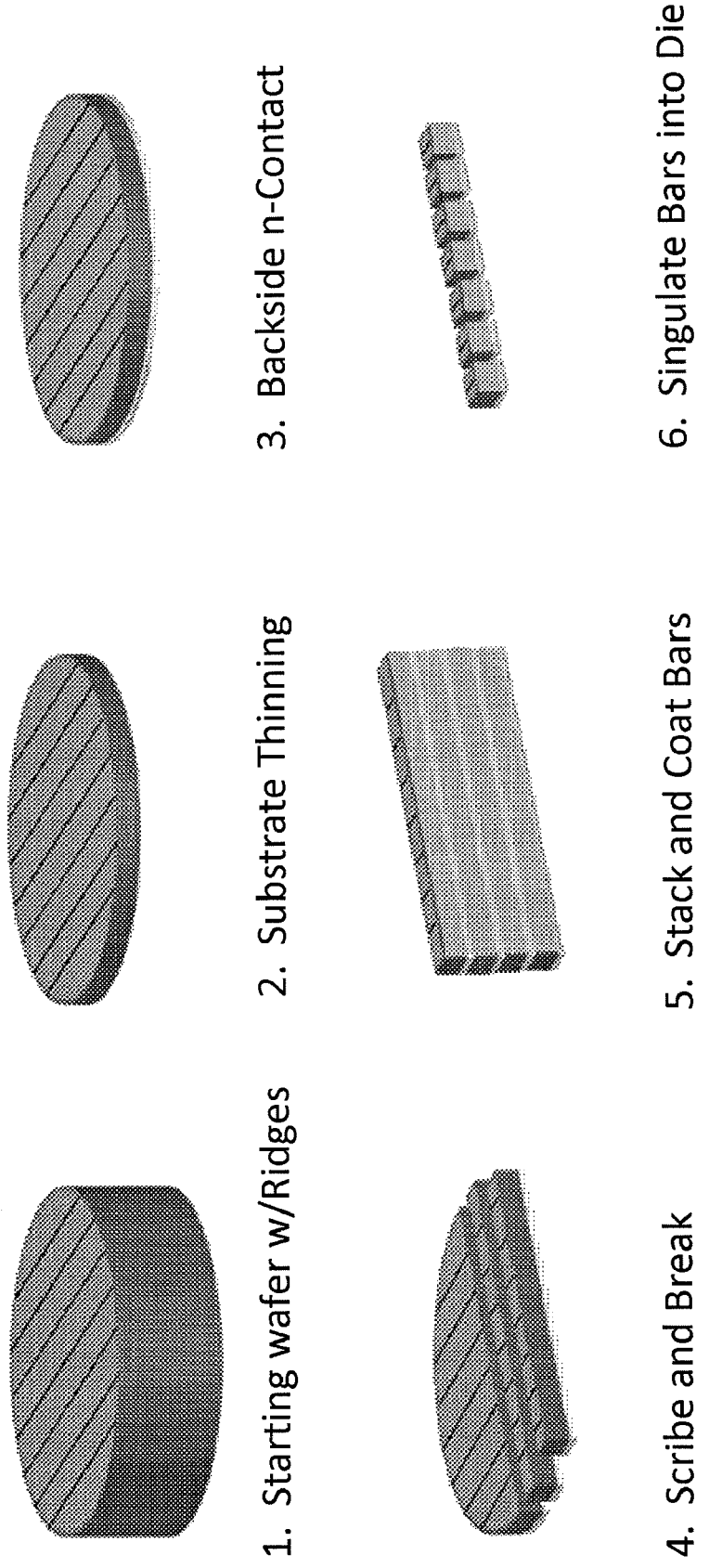

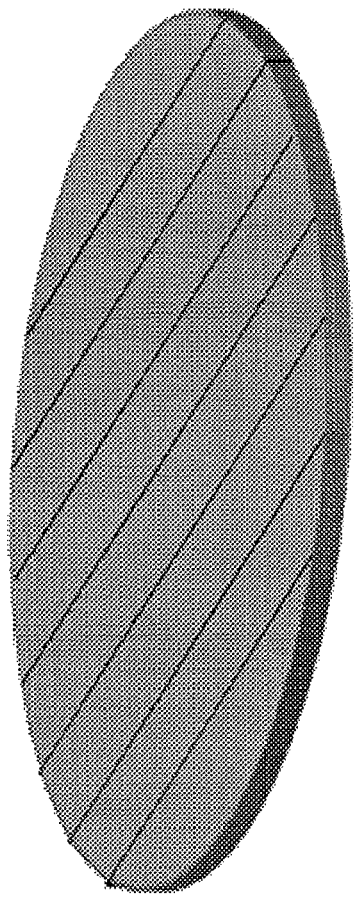
Figure 6: Substrate Thinning

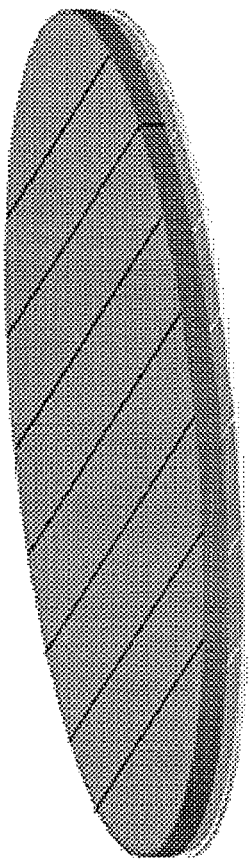
Figure 7: Backside n-Contact

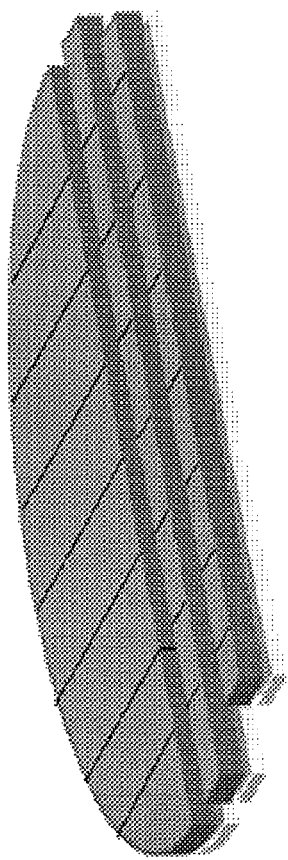
Figure 8: Scribe and Break

Figure 9: Scribe and Break
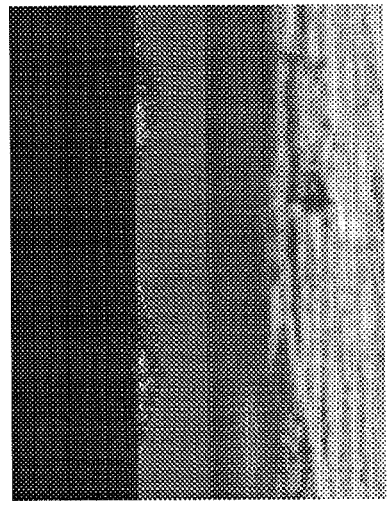
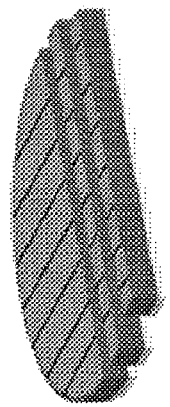
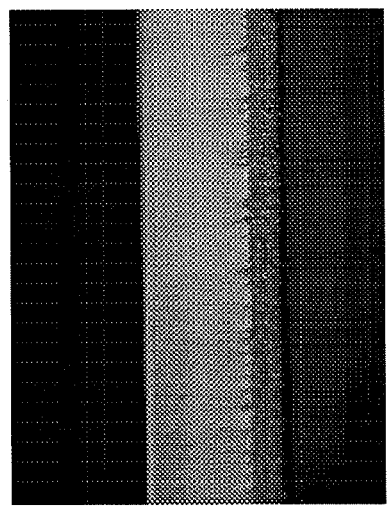

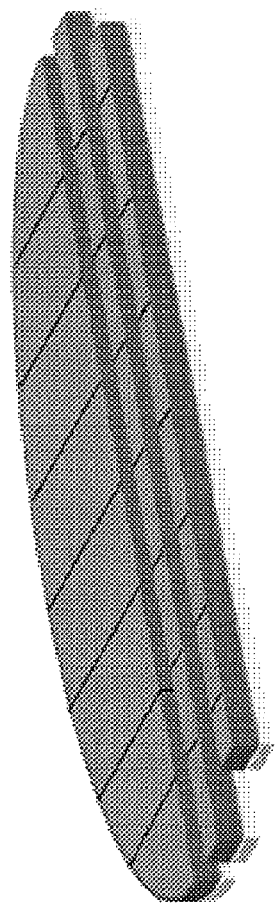
Figure 10: Scribe and Break

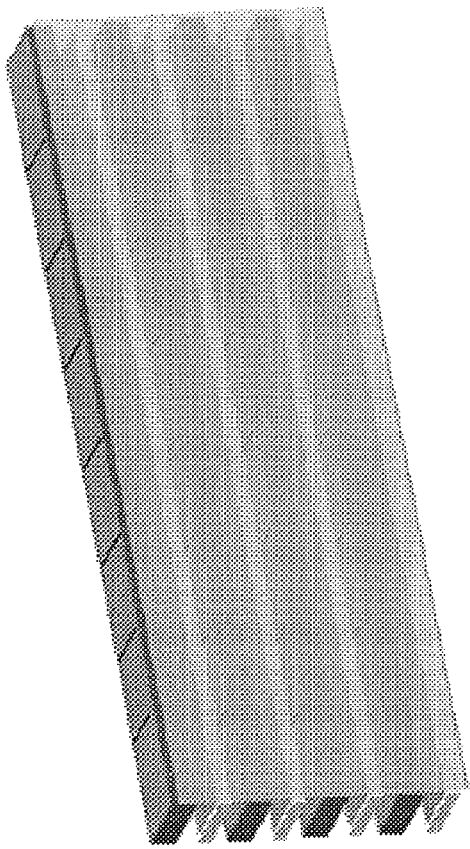
Figure 11: Stack and Coat Bars

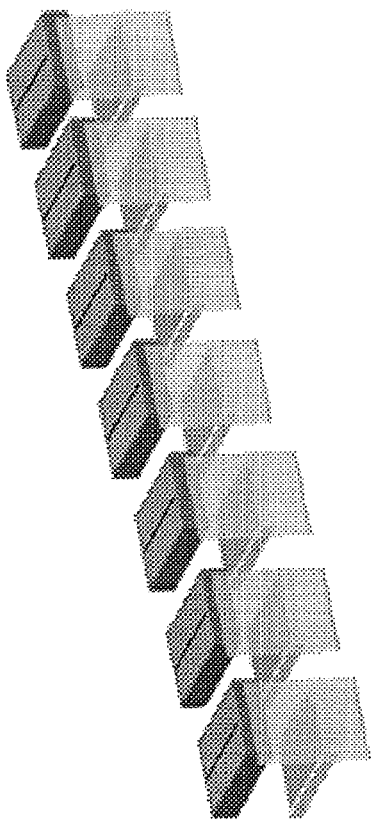
Figure 12: Singulate Bars into Die

Mount to Carrier

Lapping

Polish

Laser Scribe

HCl and HF dip

N-Contact Deposition

Figure 19: TLM Voltage versus Current Data

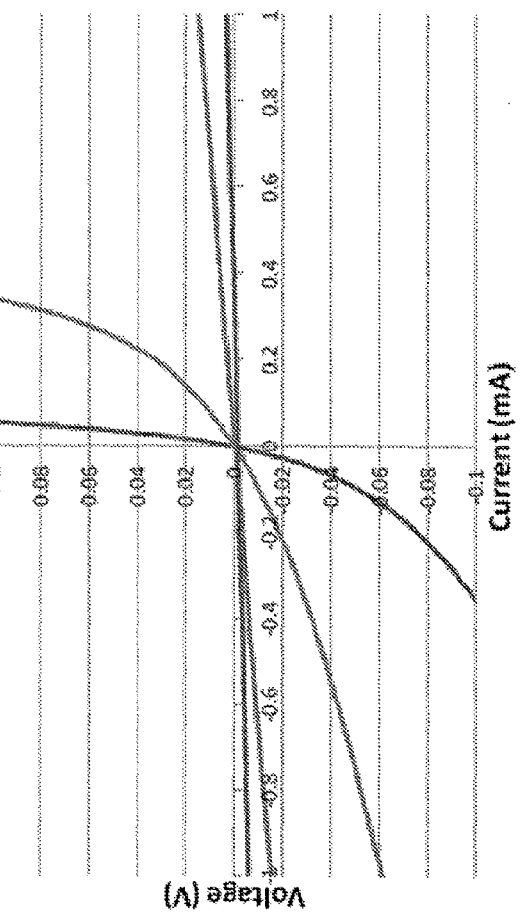

| Process ID # | Growth ID # | Substrate Doping | Process Description |
|---|---|---|---|
| 1008TL-1 (red) | K1080901CLD-1 | 1.50E+18 | lapped |
| K074TL-1 (green) | K1081223FLD-1 | 9.20E+17 | lapped, laser scribe |
| 1008TL-2 (blue) | K1080505BLD-2 | 9.60E+17 | lapped, polished |
| K101TL-1 (purple) | K1081223CLD-1 | 9.20E+17 | lapped, polished, laser scribe |

Circular TLM pattern with inner diameter of 100um and 8um spacing

→ For both lapped substrates and lapped and polished substrates, the contacts were drastically improved changing from a Schottky characteristic to an ohmic characteristic Figure 20: Images of Laser Scribe Contacting Method
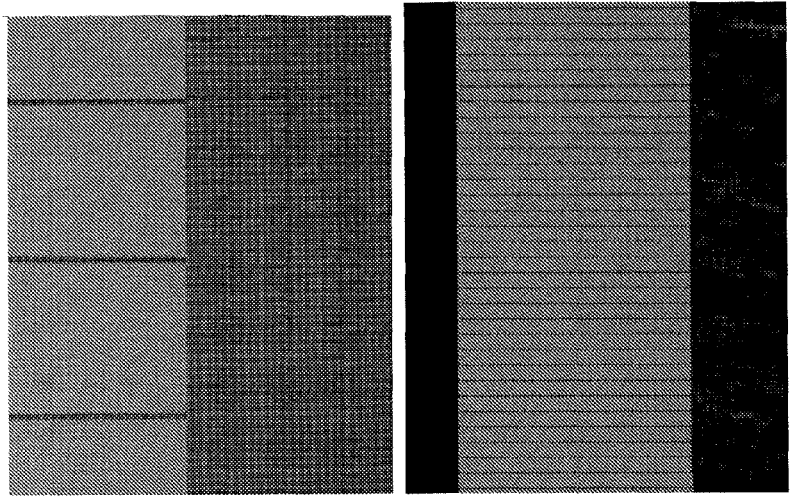
(B) Optical images of backside contacts showing laser scribe lines
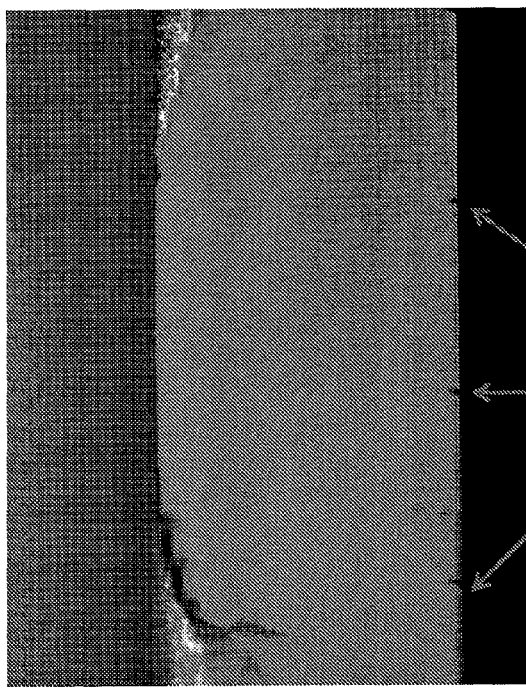
(A) Cross-sectional optical image of laser scribe marks penetrating into the substrate

Figure 21: Images of scribes on laser bar n-contacts
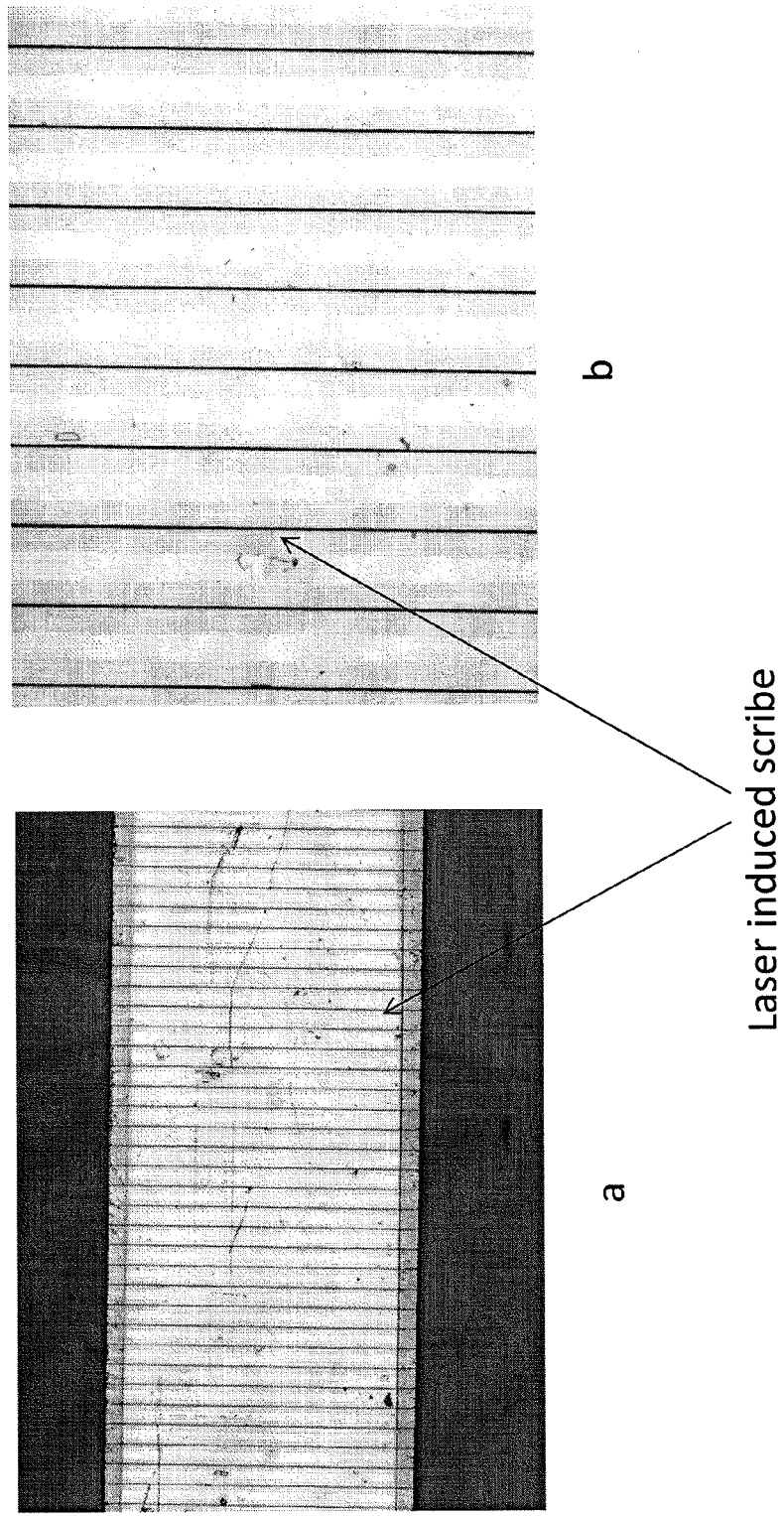
- Optical images of backside of laser bar with laser-induced scribes in n-contact region oriented in direction of laser cavity.

Figure 22

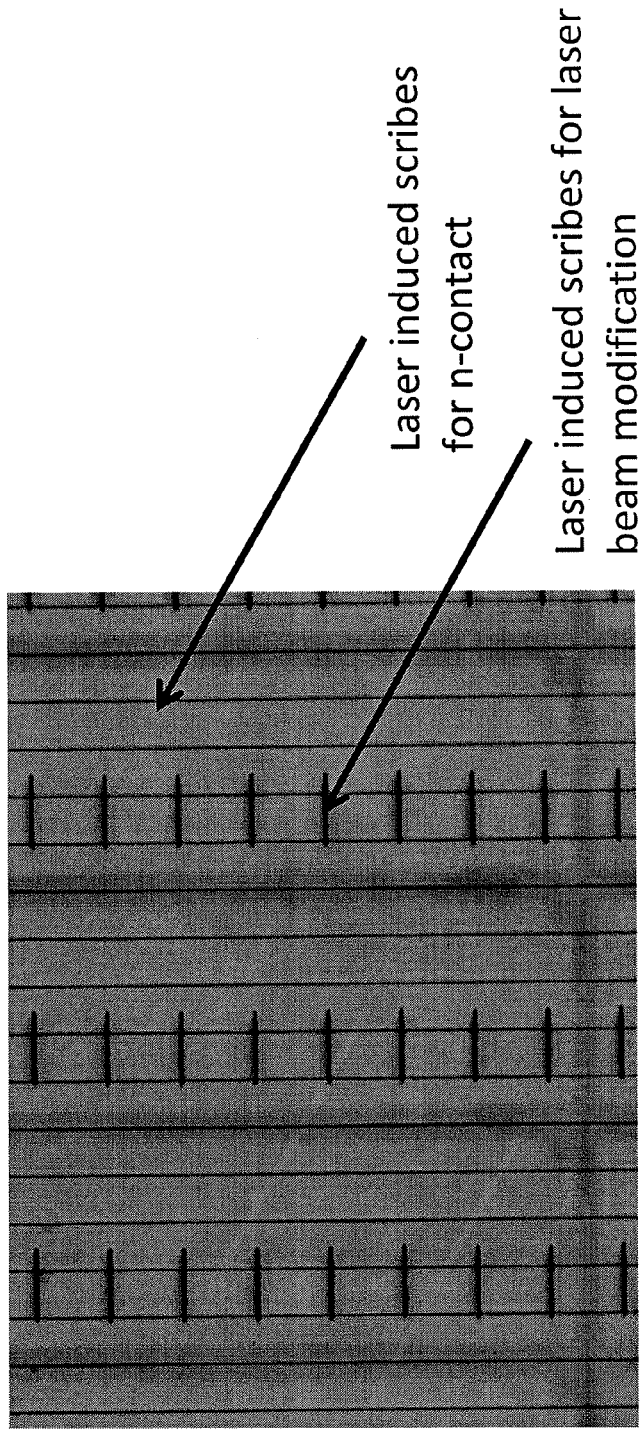

Laser induced scribes for n-contact

Laser induced scribes for laser beam modification

- Optical images of backside of laser bar with laser-induced scribes in n-contact region oriented in direction of laser cavity and deeper laser induced scribes oriented substantially perpendicular to the laser cavity intended to modify the optical beam of the laser device formed on top.

Figure 23: Images of scribes on LED n-contacts
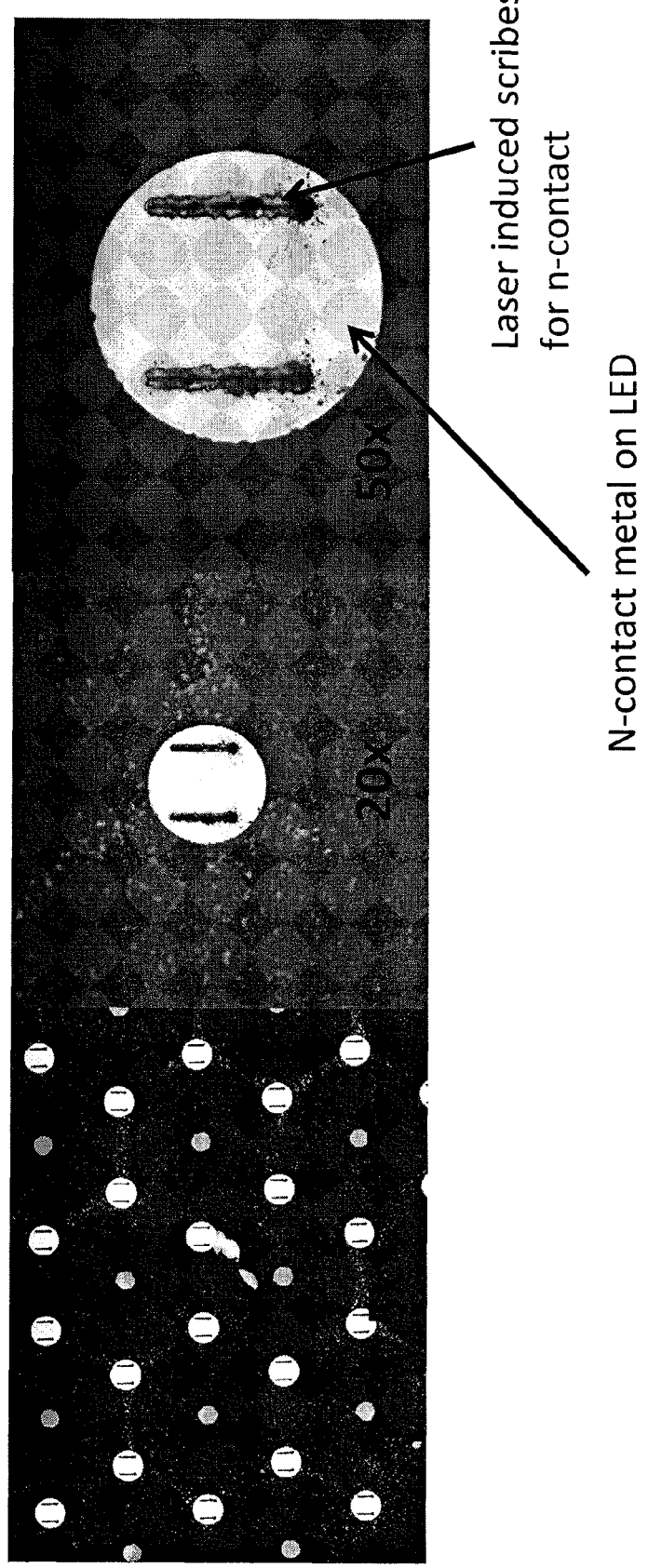
Optical images at various magnifications of circular LED n-contact pads with laser induced scribes

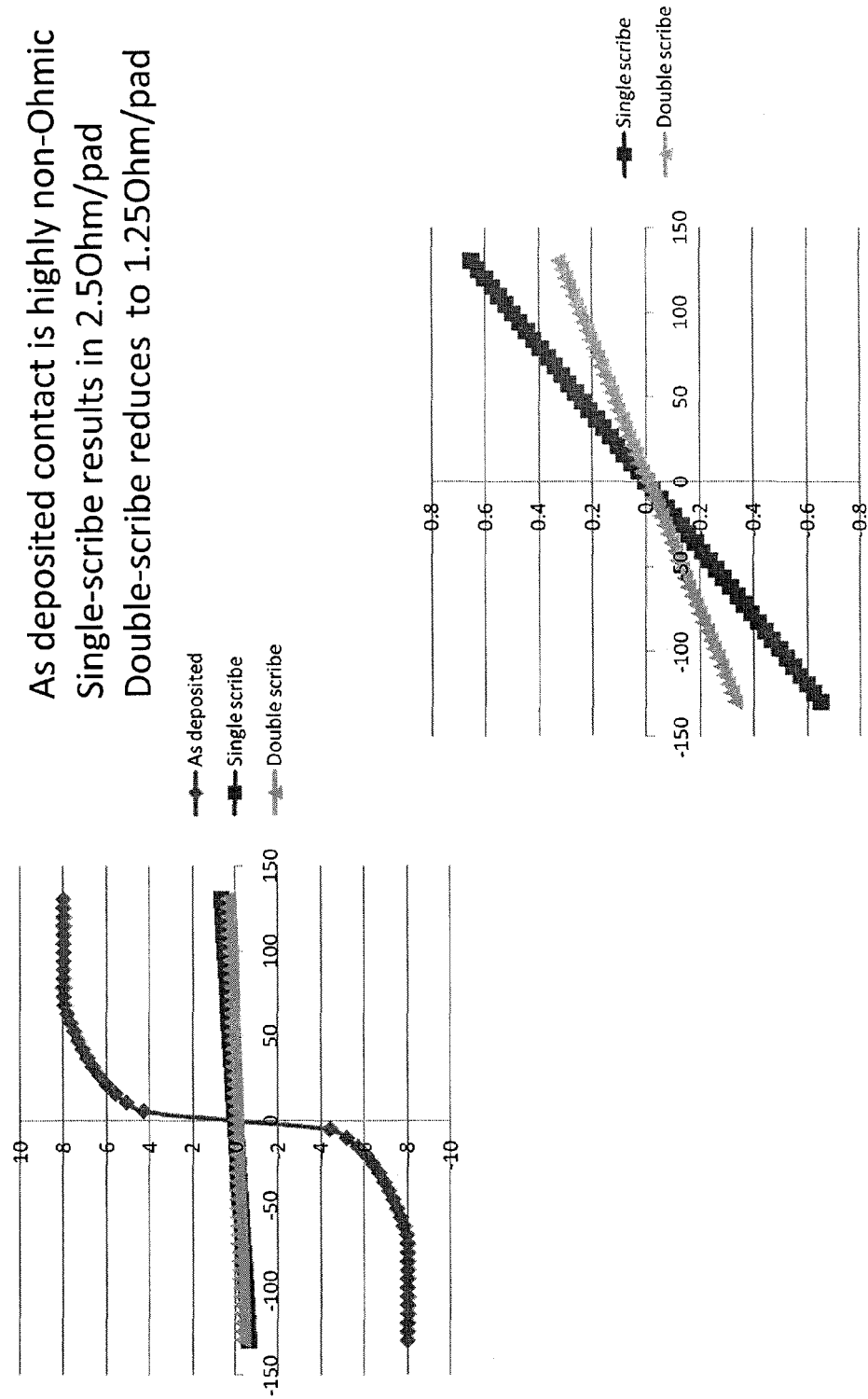
Figure 24: Contact IV with and without scribe

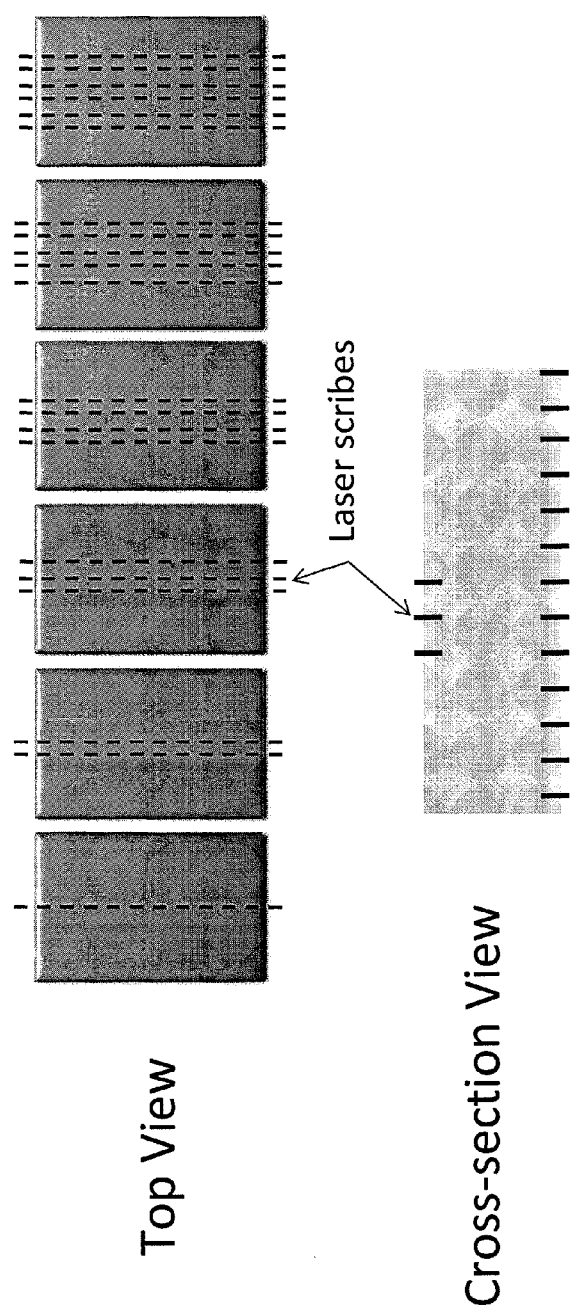

Figure 25: Experiment Description n-contacts were deposited on top and bottom on two 300um thick n-type GaN substrates. One substrate had a doping level of ~1.5E17cm-3 and the second substrate had a doping level of ~7.5E17cm-3. Voltage versus current and series resistance measurements were made on top side pads with various numbers of laser scribes. We observed a reduced voltage and reduced resistance with increased number of laser scribes

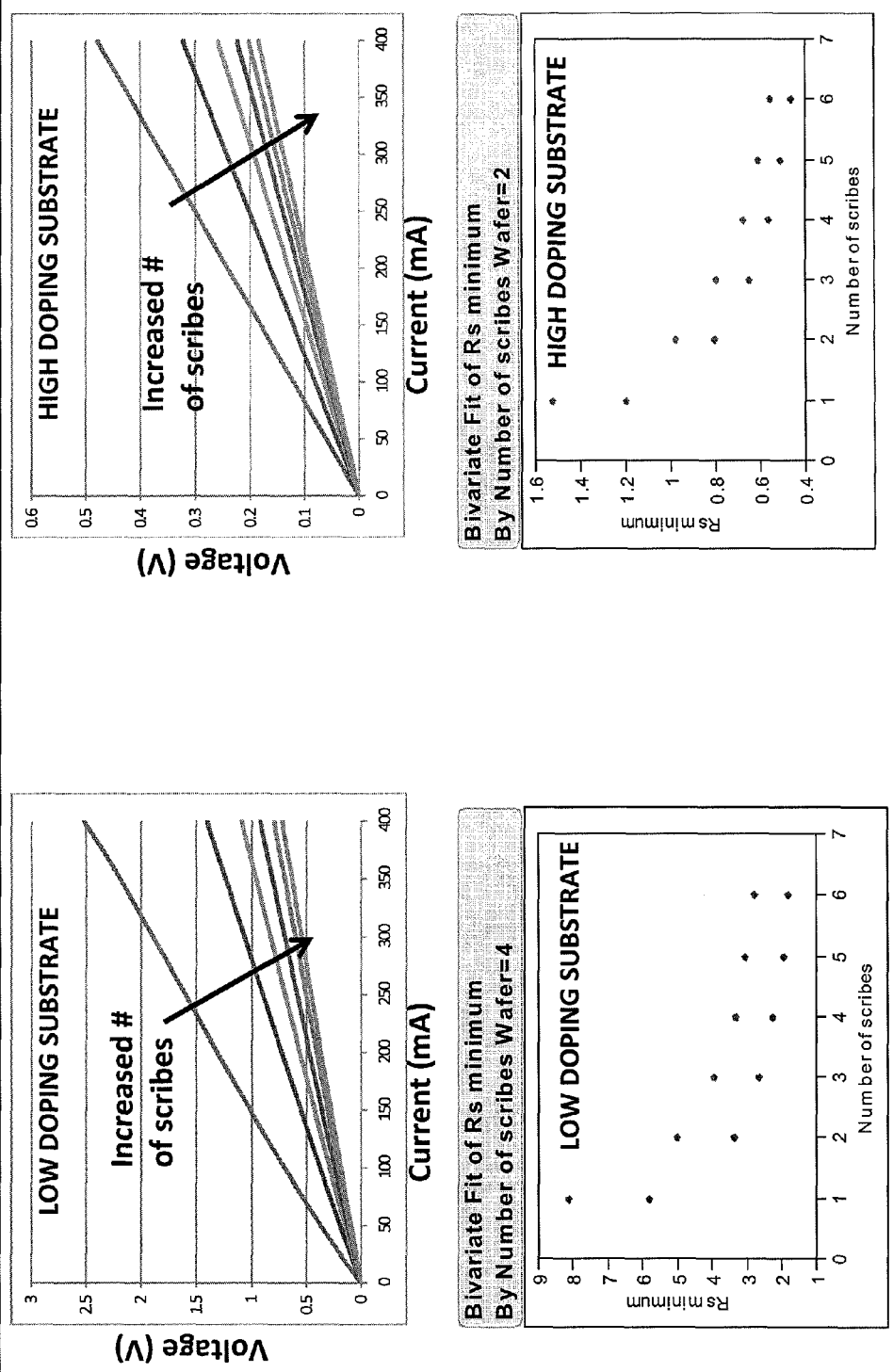
Figure 26: Voltage versus Current and Resistance plots

METHOD OF FABRICATING OPTICAL DEVICES USING LASER TREATMENT OF CONTACT REGIONS OF GALLIUM AND NITROGEN CONTAINING MATERIAL

REFERENCE TO RELATED APPLICATION

This application is a continuation-in-part and claims priority from U.S. patent application Ser. No. 12/942,817, filed Nov. 9, 2010 which is entitled: "Method of Fabricating Optical Devices Using Laser Treatment." That application is incorporated by reference herein.

BACKGROUND OF THE INVENTION

The invention is directed to optical devices and related methods. In particular, the invention provides a method and device for emitting electromagnetic radiation using nonpolar gallium containing substrates such as GaN, MN, InN, InGaN, AlGaN, and AlInGaN, and others. More particularly, the present method and device uses a laser scribing process to ablate a portion of a contact region for improved device performance. Merely by way of example, the invention can be applied to optical devices, lasers, light emitting diodes, solar cells, photoelectrochemical water splitting and hydrogen generation, photodetectors, integrated circuits, and transistors, among other devices.

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the efficiency, size, weight, and cost of the lasers were undesirable.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state lasers had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the efficiency of the LPSS lasers, and further commercialization ensue into more high end specialty industrial, medical, and scientific applications. However, the change to diode pumping increased the system cost and required precised temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging. Additionally, while the diode-SHG lasers have the benefit of being directly modulate-able, they suffer from severe sensitivity to temperature which limits their application.

From the above, it is seen that techniques for improving optical devices is highly desired.

BRIEF SUMMARY OF THE INVENTION

According to the invention, techniques related generally to optical devices are provided. In particular, the invention provides a method and device for emitting electromagnetic radiation using nonpolar gallium containing substrates such as GaN, MN, InN, InGaN, AlGaN, and AlInGaN, and others. More particularly, the present method and device uses a laser scribing process to ablate a portion of a contact region for improved device performance. In a specific embodiment, the electromagnetic radiation has a wavelength of 395, 405, 450, 485, 500, 520, nanometers and others. Merely by way of example, the invention can be applied to optical devices, lasers, light emitting diodes, solar cells, photoelectrochemical water splitting and hydrogen generation, photodetectors, integrated circuits, and transistors.

In a specific embodiment, the invention provides a method for forming optical devices. The method includes providing a gallium and nitrogen containing substrate member having a first surface region and a second surface region, and which has a contact region. Preferably, the gallium and nitrogen containing substrate member includes at least one optical device. The method includes subjecting the contact region in a portion of the substrate to a laser scribing process to form a scribe region causing a gallium rich region within a vicinity of the scribe region; while maintaining a desired thermal budget within the optical device.

In a specific embodiment, the invention provides an optical device, e.g., laser or LED. The device includes a gallium nitride substrate having a crystalline surface region and a backside region. In a preferred embodiment, the surface region is configured with a non-polar or semipolar orientation. The device has a scribe line on the backside configured from a laser process. A metallization material overlies the backside and the scribe line. The scribe region formed on a contact region improves device performance.

The invention also provides a method for forming optical devices. The method includes providing a gallium nitride substrate member having a crystalline surface region and a backside. The method includes subjecting the backside to a laser scribing process to form scribe regions on the backside and then forming a metallization material over the backside and the scribe regions. In a specific embodiment, the scribe process is followed by a break process to remove and separate the optical device from a remaining portion of the substrate member. In an alternative embodiment, the laser scribing process may be performed after forming metallization material overlying the backside. The scribe region provides improved device performance by ablating portions of the gallium and nitrogen material in the contact region.

In an alternative embodiment, the method also includes forming active regions configured to emit electromagnetic radiation for an optical device. The method forms a metallization material overlying a surface region, e.g., backside, frontside, edges, or combinations. The method includes subjecting the surface region to a laser treatment process to change the operating voltage of the optical device from a first value to a reduced second value. The method includes formation of a scribe region on the surface region, and then removing the optical device using the scribe region. The laser scribing process forms a scribe region which also causes a gallium rich region around the scribe region, yet maintains a thermal budget within the optical devices. It is believed that forming the scribe region in this manner causes nucleated gallium metal material to be formed around the scribe region.

Benefits are achieved over pre-existing techniques using the invention. In particular, the invention enables a cost-effective optical device for laser applications. The optical device can be manufactured in a relatively simple and cost effective manner. Depending upon the embodiment, the apparatus and method can be manufactured using conventional materials and/or methods. The laser device uses a nonpolar gallium nitride material to achieve a laser having a wavelength of about 400 nanometers and greater. The resulting laser or light emitting diode device has an improved contact, which is lower in resistance and provides a lower voltage drop through the device. The improved contacts use a combination of localized, high temperature annealing of the contact and intermixing between the contact metal and the gallium and nitrogen containing substrate.

A further understanding of the nature and advantages of the invention may be realized by reference to the specification and attached drawings.

BRIEF DESCRIPTION OF THE DRAWINGS

FIG. 3 is a cross-sectional view photograph of an c-direction cleaved facet for a laser device;

FIG. 4A is a cross-sectional view diagram of a scribe region for a laser device;

FIG. 4B is a cross-sectional view diagram of a scribe region for a LED device;

FIG. 4E is a top-view diagram of scribed contact regions;

FIGS. 5 to 12 illustrate a backend processing method of a laser device;

FIGS. 19 and 20 are diagram illustrating experimental results of a laser scribing process for contact formation;

FIG. 21 are images of scribe regions for laser devices;

FIG. 22 is an image of scribe regions configured in a ladder pattern;

FIG. 23 is an image of scribe regions configured in a ladder pattern;

FIG. 24 is a contact IV curve (1) with a scribe region; (2) without a scribe region; and FIGS. 25 and 26 illustrate experimental results of multiple scribe regions.

DETAILED DESCRIPTION OF THE INVENTION

Figure 1:
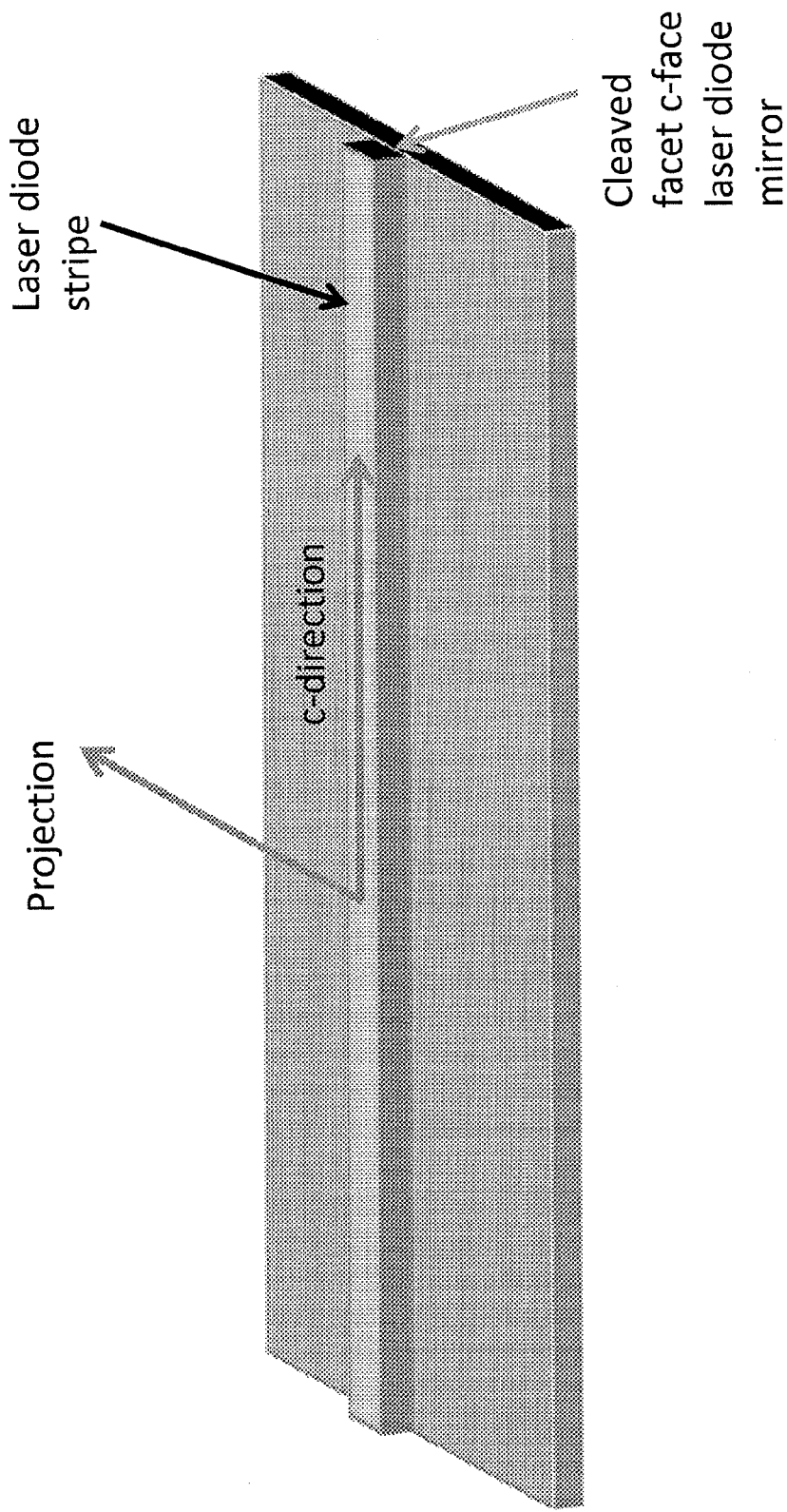
FIG. 1 is a perspective view of a laser device fabricated on a nonpolar substrate.

FIG. 1 is a perspective view of a laser device 100 fabricated on a non-polar substrate. As shown, the optical device includes a gallium nitride substrate 101 having a nonpolar crystalline surface region characterized by an orientation of about −6 degrees to about 6 degrees towards (000-1) and less than about 0.5 degrees towards (11-20). In a specific embodiment, the gallium nitride substrate is a bulk GaN substrate characterized by a nonpolar crystalline surface region. In a specific embodiment, the bulk nitride GaN substrate comprises nitrogen and has a surface dislocation density below $10^5$ cm$^{-2}$. The nitride crystal or wafer may comprise $Al_xIn_yGa_{1-x-y}N$, where $0 \leq x, y, x+y \leq 1$. In one specific embodiment, the nitride crystal comprises GaN which has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is below about $10^5$ cm$^{-2}$.

The device has a laser stripe region formed overlying a portion of the nonpolar crystalline orientation surface region. The laser stripe region is characterized by a cavity orientation is substantially parallel to the c-direction, and has a first end 107 and a second end 109.

The device has a first cleaved c-face facet provided on the first end of the laser stripe region and a second cleaved c-face facet provided on the second end of the laser stripe region. The first cleaved c-facet is substantially parallel with the second cleaved c-facet. Mirror surfaces are formed on each of the cleaved surfaces. The first cleaved c-facet provides a first mirror surface, e.g. by a scribing and breaking process. The scribing process can use any suitable techniques, such as a diamond scribe or laser scribe. The reflective coating is selected from silicon dioxide, hafnia, and titaniatantalum pentoxidezirconia, or combinations thereof, and the like. Depending upon the embodiment, the first mirror surface can also comprise an anti-reflective coating. The second cleaved c-facet provides a second mirror surface, e.g. using the same techniques.

In a specific embodiment, the laser stripe has a length from about 50 microns to about 3000 microns. The strip has a width ranging from about 0.5 microns to about 50 microns. In a specific embodiment, the width is substantially constant in dimension, although there may be slight variations. The width and length are often formed using a masking and etching process, as commonly used in the art.

In a specific embodiment, the device is also characterized by a spontaneously emitted light polarized in substantially perpendicular to the c-direction, e.g. the device performs as a laser. The light is characterized by a polarization ratio of greater than 0.1 to about 1 perpendicular to the c-direction, and a wavelength of about 405 nanometers. In a preferred embodiment, the spontaneously emitted light is highly polarized and is characterized by a polarization ratio of greater than 0.4.

Figure 2:
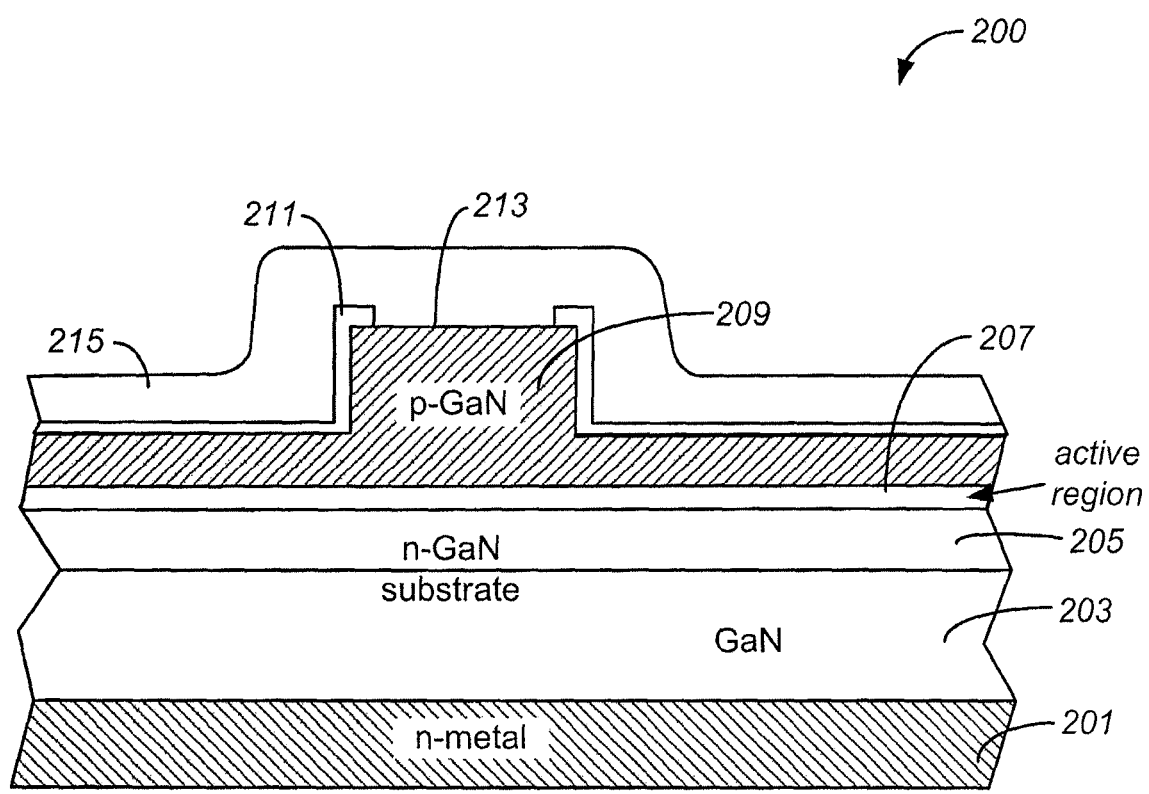
FIG. 2 is a cross-sectional view of a laser device fabricated on a nonpolar substrate.

FIG. 2 is a cross-sectional view of a laser device 200 fabricated on a nonpolar substrate according to an embodiment of the invention. As shown, the laser device includes a gallium nitride substrate 203, which has an underlying n-type metal back contact region 201. The metal back contact region is made of a suitable material such as those noted below.

The device also has an overlying n-type gallium nitride layer 205, an active region 207, and an overlying p-type gallium nitride layer structured as a laser stripe region 209. Each of these regions can be formed using an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

An n-type $Al_uIn_vGa_{1-u-v}N$ layer, where $0 \le u$, v, $u+v \le 1$, is deposited on the substrate. The carrier concentration is preferably in the range between about $10^{16}$ cm$^{-3}$ and $10^{20}$ cm$^{-3}$. The deposition may be performed using metalorganic chemical vapor deposition (MOCVD) or molecular beam epitaxy (MBE).

As an example of the process, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 to 12000. A flow of disilane in a carrier gas, with a total flow rate of between about 0.1 and 10 sccm is initiated.

The laser stripe region is made of the p-type gallium nitride layer 209 which is defined by an etching process, for example, a dry etching process using an inductively coupled process with chlorine bearing species or a reactive ion etching process using similar chemistries. The chlorine bearing species are commonly derived from chlorine gas or the like. The device also has an overlying dielectric region, which exposes 213 contact region. The dielectric region is an oxide such as silicon dioxide or silicon nitride. The contact region is coupled to an overlying metal layer 215 which can be a multilayered structure, e.g. containing gold and platinum (Pt/Au).

the laser device has active region 207 which can include, e.g. 1 to 20 quantum well regions. As an example following deposition of the n-type $Al_uIn_vGa_{1-u-v}N$ layer for a predetermined period of time, so as to achieve a predetermined thickness, an active layer is deposited. The active layer may provide a single quantum well or multiple quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \le w$, x, y, z, $w+x$, $y+z \le 1$, where w<u, y and/or x>v, z so that the bandgap of the well layer(s) is less than that of the barrier layer(s) and the n-type layer. The well layers and barrier layers may each have a thickness between about 1 nm and about 40 nm. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. In some embodiments, an electron blocking layer is preferably deposited. The electron-blocking layer may comprise $Al_sIn_tGa_{1-s-t}N$, where $0 \le s$, t, $s+t \le 1$, with a higher bandgap than the active layer, and may be doped p-type. In one specific embodiment, the electron blocking layer comprises AlGaN. In another embodiment, the electron blocking layer comprises an AlGaN/GaN super-lattice structure, with alternating layers of AlGaN and GaN, each with a thickness between about 0.2 nm and about 5 nm.

As noted, the p-type gallium nitride structure, which can be a p-type doped $Al_qIn_rGa_{1-q-r}N$, where $0 \le q$, r, $q+r \le 1$, layer is deposited above the active layer. The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer is doped more heavily than the rest of the layer to enable an improved electrical contact. The laser stripe is provided by an etching process. The device also has an overlying dielectric region, e.g. silicon dioxide to expose a contact region. In a specific embodiment, the dielectric region is an oxide such as silicon dioxide.

The metal contact is made of suitable material, e.g. silver, gold, aluminum, nickel, platinum, rhodium, palladium, chromium, or the like. The electrical contact may be deposited by thermal evaporation, electron beam evaporation, electroplating, sputtering, or another suitable technique. The electrical contact serves as a p-type or n-type electrode for the optical device.

FIG. 3 is a cross-sectional view photograph of a c-direction cleaved facet for a laser device. As shown, the c-direction cleaved facet is smooth and provides a suitable mirror surface. Details of the top-view of the laser device are provided below.

Figure 4:
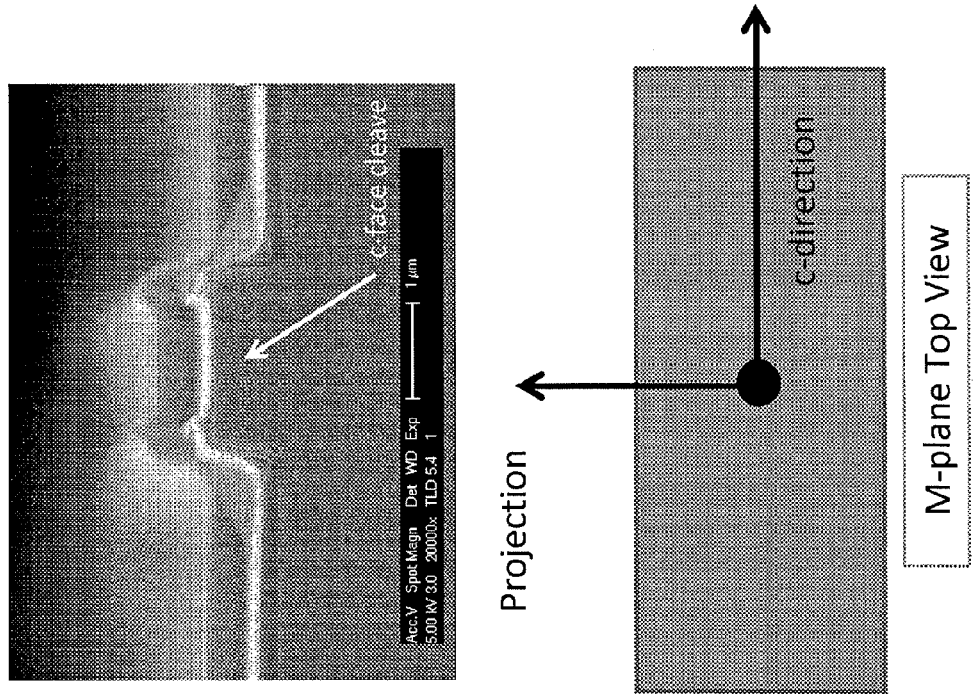
FIG. 4 is a top-view diagram of a laser device.

FIG. 4 is a top-view diagram of a laser device. As shown, the laser stripe is configured in the c-direction, which has a projection normal to the c-direction. The top-view of the gallium nitride substrate is of a slight mis-cut or off-cut surface region orientation.

FIG. 4A is a cross-sectional view diagram of a scribe region for a laser device. The laser device includes a gallium and nitrogen containing substrate having a backside region, which is configured with a scribe region, which is a v-shaped or trench shaped cut. The scribe region includes a gallium rich gallium nitride region (as shown by the dotted lines), which has a greater amount of gallium than the conventional stoichiometry of gallium nitride. The gallium rich region has higher carrier concentration than gallium nitride. The device also includes overlying metallization, which can be, e.g. an aluminum, nickel, gold stack, a titanium nickel gold stack, a titanium gold stack, a platinum material, or a silicon, aluminum, nickel, gold stack, or other material. The metallization is substantially free from damage and has been formed after the laser scribing process.

The scribe region is formed on an n-type contact, which is a nitrogen face for c-plane. In other embodiments, the scribe region may be formed on other planes, e.g. semipolar, nonpolar. The nitrogen face is often more difficult for an ohmic-contact. The process forms an ohmic-contact, which is substantially Schottky free in characteristic. In a specific embodiment, metal nucleation (not shown) also forms within a vicinity of the scribe region, but is later removed. Laser devices are formed on the face opposite of the metallization, and are substantially free from damage by way of localized heating from the laser process.

FIG. 4B is a cross-sectional view diagram of a scribe region for a LED device. As shown, the present LED device includes a gallium and nitrogen containing substrate. The substrate includes a backside region, which is configured with a v-shaped or trench shaped cut. The scribe region has been provided by a laser scribe process further described below. The scribe region includes a gallium rich gallium nitride region (as shown in the dotted lines), which has a greater amount of gallium than the conventional stoichiometry of gallium nitride. The gallium rich region has higher carrier concentration than gallium nitride.

The device also includes an overlying metallization, which can be an aluminum, nickel, gold stack, a titanium nickel gold stack, a titanium gold stack, a platinum material, or a silicon, aluminum, nickel, gold stack, or other material. As shown, the metallization has been damaged from the laser process and portions of the metallization form an alloy with the gallium and nitrogen containing material. The scribe region is preferably formed on an n-type contact, which is a nitrogen face for c-plane. In other embodiments, the scribe region may be formed on other planes, e.g, semipolar, non-polar. The nitrogen face is often more difficult form an ohmic-contact. By way of the laser scribe region, the invention forms an ohmic-contact, which is substantially Schottky free in characteristic. LED devices are formed on the face opposite of the metallization. The LED devices are substantially free from damage by way of localized heating from the LED process.

Figure 4C:
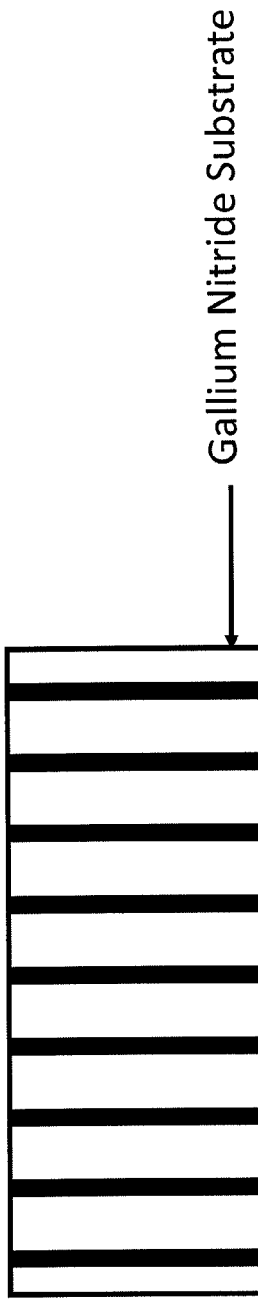
FIG. 4C is a top-view diagram of scribe regions for laser devices.

FIG. 4C is a top-view diagram of scribe regions for laser devices. As shown, the top-view is representative of a backside of a laser device. The backside of the laser device can be for an n-contact region, and others. The n-contact region can be a nitrogen face for c-plane, but can be other plans, e.g., semipolar, non-polar. In a specific embodiment, the laser scribes are formed in a parallel arrangement from a first region to a second region of the backside. The laser scribes are provide within regions of the contacts and are not used for breaking purposes. Scribing contact regions improves carrier concentration and device performance. On the front side, the substrate includes a plurality of laser devices.

Figure 4D:
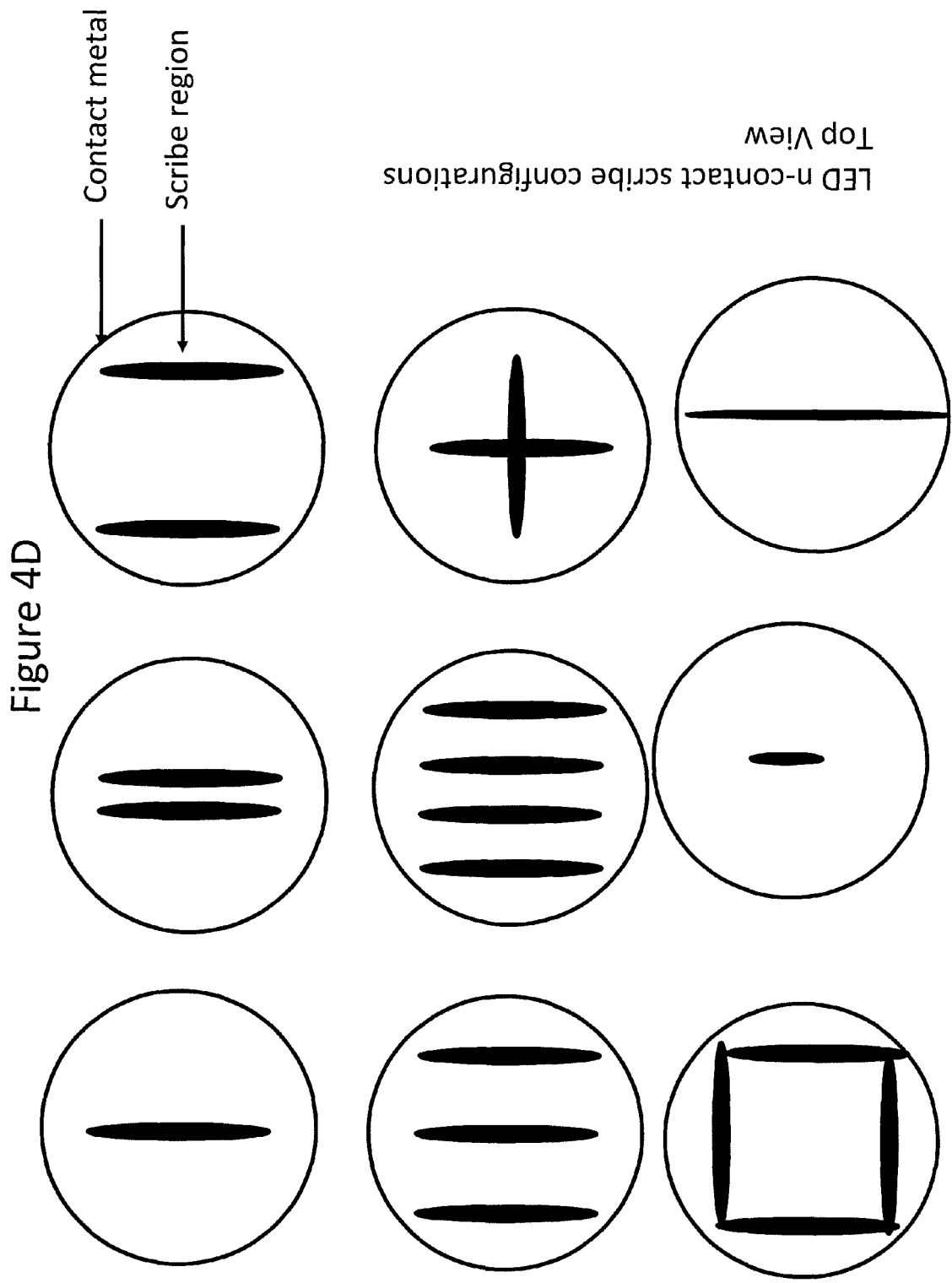
FIG. 4D is a top-view diagram of various contact regions including scribe region patterns.
Figure 13:
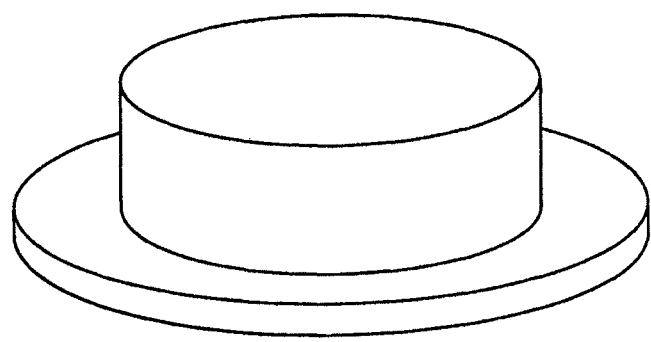
FIGS. 13 to 18 illustrate a laser scribe process for improving contact regions of an optical device.
Figure 14:
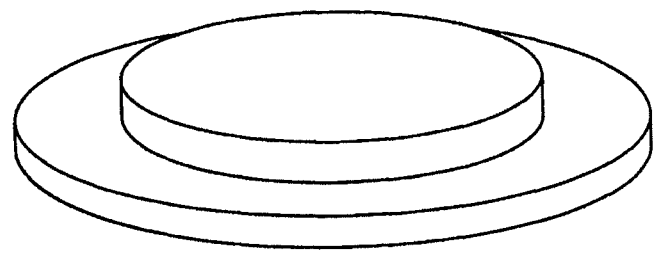
Figure 15:
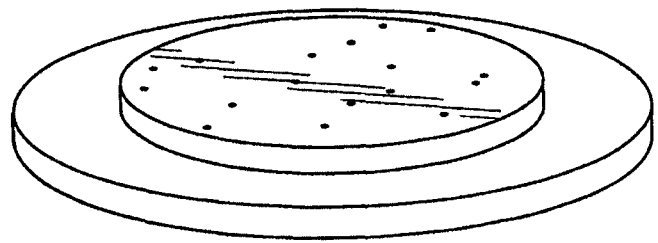
Figure 16:
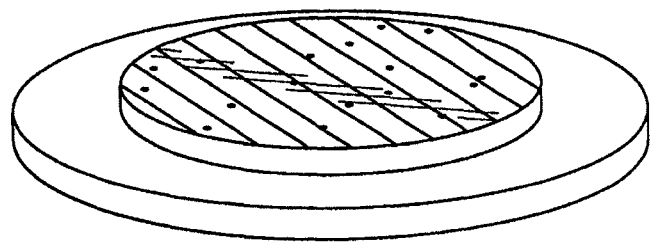
Figure 17:
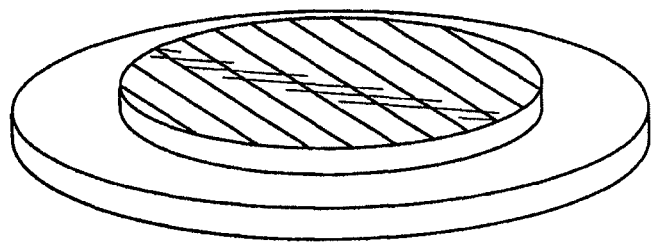
Figure 18:
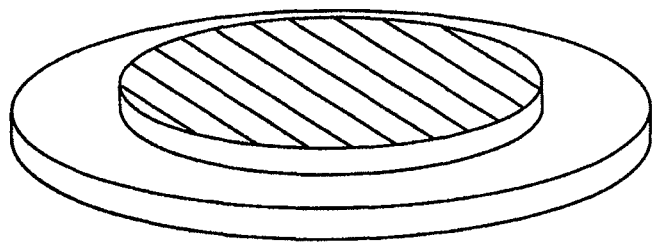

FIG. 4D is a top-view diagram of various contact regions including scribe region patterns. As shown, various contact regions are illustrated by respective annular regions, e.g., circular in shape. Each of the annular regions is configured with laser scribe patterns having a width, a shape, a depth, and a length. Depending upon the embodiment, multiple patterns can be used. As shown include (from left to right and then top to bottom) a single scribe line, multiple scribe lines in parallel to each other and separated by a gap of about a width of the scribe line, multiple scribe lines in parallel to each other and separated by a larger gap than a width of the scribe line, three scribe lines in parallel to each other, four scribe lines in parallel to each other, two scribe lines in a cross formation, four scribe lines in a box formation, a smaller single scribe line, and a longer single scribe line configured across a diameter of the contact region.

In preferred embodiment, the present method and device includes multiple scribe lines, which are separated by at least a width of the scribe line. In a more preferred embodiment, a higher number of scribes is preferred over a lower number. In an additional preferred embodiment, the scribe patterns are configured in a box like manner. These scribe patterns achieve improved contact performance leading to improved device performance.

FIG. 4E is a top-view diagram of scribed contact regions. As shown, the gallium and nitrogen containing substrate includes a plurality of annular contact regions. Each of the contact regions corresponds to at least one optical device, e.g., LED. The contact regions are formed on a backside of the substrate, which is an n-type contact region. Ohmic contacts are achieved on each of the n-type contact regions. The scribe region penetrates into a portion of the gallium and nitrogen containing substrate, and through a portion of the metallization, which may be formed before or after the scribe region. Again, the scribe region is not for separating the optical device.

A method of processing a laser device according to one or more embodiments is:
 1. Start;
 2. Provide processed substrate including laser devices with ridges;
 3. Thin substrate from backside;
 4. Form backside n-contact;
 5. Scribe pattern for separation of the laser devices configured in bar structures;
 6. Break scribed pattern to form a plurality of bar structures;
 7. Stack bar structures;
 8. Coat bars structures;
 9. Singulate bar structures into individual dies having laser device; and
 10. Perform other steps as desired.

The above sequence of steps is used to form individual laser devices on a die from a substrate structure. In one or more embodiments, the method includes cleaved facets substantially parallel to each other and facing each other in a ridge laser device configured on a non-polar gallium nitride substrate material.

A method of processing a LED device according to one or more embodiments is:
 1. Start;
 2. Provide substrate with a plurality of LED devices thereon;
 3. Lapping and polishing on backside of substrate;
 4. Form n-contact pads via a liftoff process or alternatively a deposition and patterning, e.g,. etching process;
 5. Scribe n-contact pads using a UV laser configured with a power of about 30-300 mWatts;
 6. Continue to scribe one or more lines on each pad using the laser;
 7. Optionally, perform cleaning process using a de-ionized water and/or acid rinse;
 8. Perform other steps as desired; and
 9. Stop.

The above sequence of steps is used to form individual LED devices on a die from a substrate structure. The method includes scribing before or after n-contact pad definition.

FIG. 6 is a illustrating of a substrate thinning process according to an embodiment of the invention. In a specific embodiment, the method begins with a gallium nitride substrate material including laser devices and preferably ridge laser devices. The substrate has been subjected to front side processing. After front side processing has been completed, one or more of the GaN substrates are mounted front side down onto a sapphire carrier wafer or other suitable member. As an example, the method uses Crystalbond 509, a conventional mounting thermoplastic. The thermoplastic can be dissolved in acetone or other suitable solvent.

In a specific embodiment, the carrier wafer is mounted to a lapping jig. An example of such lapping jig is made by Logitech Ltd. (Logitech) of the United Kingdom, or other vendor. The lapping jig helps maintain planarity of the substrates during the lapping process. As an example, the starting thickness of the substrates are ~325 um+/−20 um. In a specific embodiment, the method laps or thins the substrates down to 70-80 um thickness. In a preferred embodiment, the lapping jig is configured with a lapping plate, which is often made of a suitable material such as cast iron configured with a flatness of less than 5 um. Preferably, the method uses a lapping slurry that is 1 part silicon carbide (SiC) and 10 parts water, with SiC grit about 5 um in dimension, and a lapping plate speed of about 10 revolutions per minute. Additionally, the method can adjust the lapping jig's down pressure to achieve a desired lapping rate, such as 2-3 um/min.

The lapping process may produce subsurface damage in the GaN material to cause generation of mid level traps or the like. The midlevel traps may lead to contacts having a Schottky characteristic. Accordingly, the present method includes polishing processes such that ~10 um of material having the damage is removed. As an example, the method uses a Politex™ polishing pad of Rohm and Haas that is glued onto a stainless steel plate. A polishing solution is Ultrasol300K manufactured by Eminess Technologies. The Ultra-Sol 300K is a high-purity colloidal silica slurry with a specially designed alkaline dispersion. It contains 70 nm colloidal silica and has a pH of 10.6. The solids content is 30% (by weight). In a specific embodiment, the lapping plate speed is 70 rpm and the full weight of the lapping jig is applied to provide a polishing rate of about ~2 um/hour.

The invention provides a method for achieving high quality n-type contacts for m-plane GaN substrate material. The method provides contacts that are rough to achieve suitable ohmic contact. The roughness causes exposure of other crystal planes which leads to good contacts. In another embodiment, the method includes a lapped surface, which is rough to expose different crystal planes. In other embodiments, lapping may be followed by etching to remove subsurface damage. In a preferred embodiment the sample is subjected to a lapping step, a polishing step, and is then subjected to the laser scribe.

FIG. 7 is a diagram illustrating a backside n-contact method. After the thinning process is complete, the method forms n-contacts on the backside of the substrates. At this point, the thinned substrates are still mounted to and maintained on the sapphire wafer. The thinned substrates are "batch processed" for efficiency and handling to help prevent damage associated with handling very thin (e.g., 60-80 um) substrates.

As an example, the backside contact includes about 300 Å Al/3000 Å Au or other suitable materials. The contact is a stack of metals that are deposited by e-beam evaporation or other suitable techniques. Prior to the metal stack deposition, a wet etch with hydrofluoric acid can remove any oxides on the surface. In a specific embodiment, the metal stack is preferably not annealed or subjected to high temperature processing after its formation.

FIG. 8 is a diagram illustrating a scribe and break operation. After the n-contact is formed, the substrates are demounted from the sapphire carrier wafer and cleaned in acetone and isopropyl alcohol. The substrates are then mounted onto vinyl tape for the scribe and break process. The tape does not leave any residue on the laser bars, which are substantially free from such residues, which are often polymeric in nature or particulates.

Next, the method includes scribing processes. In a specific embodiment, the method includes subjecting the substrates to a laser for pattern formation. The pattern is configured for formation of a pair of facets for ridge lasers. The pair of facets face each other and are in parallel alignment with each other. A UV (e.g., 355 nm) laser can be used to scribe the laser bars. The scribing can be performed on the backside, front side, or both depending upon the application.

In a specific embodiment, the method uses backside scribing. With backside scribing, a continuous line scribe is formed perpendicular to the laser bars on the backside of the substrate. The scribe is generally 15-20 um deep. The scribe process does not depend on the pitch of the laser bars or other like pattern. Backside scribing can lead to a higher density of laser bars on each substrate. In a specific embodiment, backside scribing, however, may lead to residue from the tape on the facets. Backside scribe often requires that the substrates face down on the tape. With front side scribing, the backside of the substrate is in contact with the tape.

In one embodiment, the method uses front side scribing, which facilitates formation of clean facets. The method includes a scribe pattern to produce straight cleaves with minimal facet roughness or other imperfections. The pitch of the laser mask is about 200 um. The method uses a 170 um scribe with a 30 um dash for the 200 um pitch. In a preferred embodiment, the scribe length is maximized or increased while maintaining the heat affected zone of the laser away from the laser ridge, which is sensitive to heat. A saw tooth scribe profile generally produces minimal facet roughness. It is believed that the saw tooth profile shape creates a very high stress concentration in the material, which causes the cleave to propagate much easier and/or more efficiently.

FIG. 9 illustrates cross-sections of substrate materials associated with (1) a backside scribe process; and (2) a front side scribe process.

Referring now to FIG. 10, the method includes a breaking process to form a plurality of bar structures. After the GaN substrates are scribed, the method uses a breaker to cleave the substrates into bars. In a specific embodiment, the breaker has a metal support that has a gap spacing of 900 um. The substrate is positioned over the support so that the scribe line is in the centered. A suitably sharp ceramic blade, then applies pressure directly on the scribe line causing the substrate to cleave along the scribe line.

FIG. 11 is a diagram illustrating a stacking and coating process. After cleaving, the bars are stacked in a fixture that allows for coating the front facet and back facet, which are in parallel alignment with each other and facing each other. The front facet coating films can be selected from any suitable low reflectance design (AR design). The AR design includes a quarter-wave coating of $Al_2O_3$ capped with a thin layer of $HfO_2$ according to a specific embodiment. The $Al_2O_3$ coating is a robust dielectric, and $HfO_2$ is dense, which helps environmentally passivate and tune the reflectance of the front facet. These coating films are preferably deposited by e beam evaporation. In a specific embodiment, the back facet is coated with a high reflectance HR design. The HR design includes several quarter-wave pairs of $SiO_2/HfO_2$. Roughly 6-7 pairs may be used to achieve a reflectance over 99%.

The method uses a suitable deposition system configured for deposition of each of the facets without breaking vacuum. The deposition system includes a dome structure with sufficient height and spatial volume. The plurality of bars in a fixture can be flipped from one side to the other side to expose the back and front facets. The method allows for first deposition of the back facet, reconfiguring the bar fixture to expose the front facet, and then a second deposition of the front facet without breaking vacuum. The method allows for deposition of one or more films on front and back without breaking vacuum.

FIG. 12 illustrates a method directed to singulate bars into a plurality of die. After the facets of the bars have been coated, the method includes testing the laser devices in bar form prior to die singulation. In a specific embodiment, the method singulates the bars by performing a scribe and break process (similar to the facet cleave). Preferably, the method forms a shallow continuous line scribe on the top side of the laser bar according to a specific embodiment. The width of each die is about 200 um, which may reduce the support gap to 300 um or so. After the bars have been cleaved into individual die, the tape is expanded and each of the die is picked off of the tape. Next, the method performs a packing operation for each of the die according to one or more embodiments.

The above sequence of steps is used to form individual laser devices on a die from a substrate structure. The method creates cleaved facets substantially parallel to each other and facing each other in a ridge laser device.

In a preferred embodiment, the invention provides a method for forming a contact (e.g., n-type) to one or more of the nonpolar laser diodes, light emitting diodes, and other applications using a laser scribe technique. We discovered that it was difficult to form an n-contact to nonpolar and semipolar GaN surfaces after wafering, lapping, or polishing. Each of these processes creates surface crystalline damage that can result in a Schottky contact. It was desired to propose techniques to remove the crystalline damage and/or improve contact characteristics. Further, it is believed that making a good n-contact to nonpolar substrates is a difficult task even without the presence of crystal damage.

Our method uses wet etching and/or dry etching of the damaged surface prior to depositing the n-contact to remove the damage. However, there are few wet chemistries that actually etch GaN, and the wet etches that we evaluated actually resulted in a degraded n-contact resistance. More specifically, as examples, KOH, $HPO_4$, and $HNO_3$ based wet etch treatments were used. Dry etching with etching gases such as $Cl_2$, Ar, and $BCl_3$, slightly improved the surface, but the contacts were still slightly Schottky.

The method uses a laser scribing technique for contact formation. After repeated efforts to form ohmic contacts to the bulk GaN substrates, we discovered that if the substrate is laser scribed before or after the contact metallization is deposited, the contact resistance can be greatly reduced. That is, by laser scribing the backside, we made desirable ohmic contacts to surfaces that have been subjected to a lapping process, a polishing process, both a lapping and a polishing process, and KOH etched, although there may also be other combinations.

In a preferred embodiment, the invention uses a laser scriber technique and system. The laser scriber system is generally used in a scribe and break process, which is similar to the one for creating laser diode facets or to singulate laser die and LED. As an example, the scribe tool is configured with a 355 nm UV laser and an XY table. The scribe tool is configured to form various scribe patterns and depths in the GaN substrate material.

The scribe process can be applied to either or both pre-metallization and post-metallization. We initially discovered the scribe process when singulating laser die using a laser scribe on the backside of laser devices, which were metalized. We discovered a large voltage drop across the laser device when using the laser scribe process for die singulation. It was initially thought the laser scribe was locally alloying the material in the scribe line. We also evaluated the laser scribe pre-metallization and observed similar characteristics, so it is modifying the GaN as well.

It is not clear about the mechanism that generates the good ohmic contact from laser scribing. The laser scribing could be benefiting the contact through locally heat treatment of the semiconductor by annealing damaged material, by creating some beneficial elemental diffusion profile, creating a gallium rich metallic surface, recrystallizing the damaged surfaces, or other influences. The laser scribe could also create a gallium rich spike that penetrates the damaged material into the undamaged bulk material. Or it could be something that is independent of damage, such as exposing one or more additional crystallographic planes to contact or creating some highly conductive layer in the vicinity of the scribe. That is, the overlying contact metallization is formed overlying the substrate, edges of scribe region, and bottom region of trenched region. In one or more embodiments, the bottom and/or edges may expose additional crystallographic planes. Of course, the benefit could be resulting from any combination of the above or others characteristics. The present backside contact process for lasers is described below.

1. Lap GaN substrates with a 5 um SiC (e.g., Logitech) or suitable slurry on cast iron lapping plate from ~330 um to 80 um;
2. Polish substrates with colloidal silica (e.g., Eminess Tech, 300K or others) on Politex (e.g., Rodel) pad from 80 um to 70 um;
3. Perform backside laser scribe on the entire backside of the substrate parallel to the laser ridges: 2 to 20 mm/s feed rate, 10 to 50 mW power, 10 to 100 um pitch (although there may be other variation, modifications, and alternatives). This generates a continuous scribe that is ~3-5 um deep, which causes a reduction in resistance from a non-ohmic contact to an ohmic contact. In other embodiments, the scribe can also be 3-60 microns and greater.
4. HCl dip to remove excess surface slag;
5. HF dip to remove colloidal silica from polish;
6. Sputter Al/Ni/Au to form contact region; and
7. Perform other steps, as desired Alternative embodiments can include:
1. Using any metal stack as the n-contact, e.g., Al/Ni/Au, Al/Pt/Au, Ti/Pt/Au;
2. Performing the laser scribe after the metal is deposited in a different sequence from the above;
3. Not including a lapping and/or polishing step, which may also be replaced with other processes;
4. Lapping to different thicknesses;
5. Using some other agent(s) to remove surface slag such as HF or other combinations of etchants, cleaning solutions, slurries, and the like;
6. Not removing the surface slag;
7. Using alternative laser power settings;
8. Using a laser scribe pattern;
9. Using nonpolar or semipolar substrates;
10. Using low laser power settings to locally heat the material, not create a scribe; and The above sequence of steps is used to form individual laser devices on a die. The method includes laser scribed backside regions for improved contact formation configured on a non-polar gallium nitride substrate material. In some embodiments, the invention performs backside die singulation with the laser scriber for only die singulation purposes. In other embodiments, the method and structure provide for a laser scribed contact, which has improved conductivity.

FIGS. 13 to 18 illustrate a laser scribe process for improving contact regions of an optical device.

Mount to Carrier
After frontside processing, the GaN substrate is mounted frontside down onto a sapphire wafer with Crystalbond 509.

Lapping
The GaN substrate is thinned from ~330 um to 80 um by lapping with 5 um SiC on a cast iron plate. We use a Logitech lapping system and jig to perform this process. Note that the surface is rough after this process.

Polish
To remove surface roughness and subsurface damage, the GaN substrate is polished from 80 um to 70 um by polishing with colloidal silica on a polishing pad. We use a Logitech lapping system and jig to perform this process. The colloidal silica (300K) is manufactured by Eminess and pad (Politex) is manufactured by Rodel. Note that the surface is smooth, but small amounts of colloidal silica is still attached to the surface.

Laser Scribe
The laser scribe is performed on the backside of the substrate. The scribe parameters are: power: 25 mW, scan speed: 10 mm/s, pattern: continuous line on a 40 um pitch these lines are parallel to the ridges on the frontside. The scribe depth is ~3-5 um deep HCl and HF Dip
After the laser scribe, there is slag present on the surface. This is removed by a 5 min dip in HCl. In addition, we remove the colloidal silica with a 1 min dip in HF. This also helps remove any native oxides on the GaN surface.

N-Contact Deposition
The N-contact is deposited with our DC magnetron sputter system. The metal stack is the following: Al/Ni/Au 300/200/3000 A.

The above sequence of steps is used to form individual laser devices on a die from a substrate structure. The method includes laser scribed backside regions for improved contact formation configured on a non-polar gallium nitride substrate material. The scribe lines are arranged in a spatial configuration, e.g. as an annular segment, a circular segment, a straight line segment, an irregular line segment, or combinations.

EXAMPLE

FIGS. 19, 20(A), and 20(B) are diagram illustrating experimental results of a laser scribing process for contact formation according to the invention. FIG. 19 shows an IV curve from a set of Transmission Line Models (TLM's) that were fabricated on top of 4 different GaN backside surfaces: lapped, lapped and laser scribed, lapped and polished, and lapped, polished and laser scribed. As used herein, TLM stands for Transmission Line Model, which is a measure technique for resistance of contacts along with the sheet resistance of the one or more materials having the deposited metallization contacts. Typically the measurements are performed by varying the distances between the two metal contacts and plotting resistance versus distance of the contacts. From the line that is formed on the plot, the contact resistance and the sheet resistance are deduced. As shown are current versus voltage curves in the plots. The curves are for the different n-contact schemes on the same or similar geometry/distance TLM feature deposited on the samples. The lower voltage for a fixed current or higher current for a fixed voltage for the laser scribed samples indicates lower resistance, which is likely mainly attributed to the lower contact resistance, but could also have some contribution from lower sheet resistance. The TLM pattern is circular with inner diameter of 100 um and 8 um spacing. For both lapped substrates and lapped and polished substrates, the contacts were drastically improved changing from a Schottky characteristic to an ohmic characteristic.

FIG. 20(A) shows a cross-sectional optical image of the laser facet. The ridge can be seen on the front side (top) and the n-contact laser scribes can be seen on the backside (bottom). One can also see the front side (top) laser scribes that were used to create the facet. FIG. 20(B) shows an optical image of laser scribes on the backside of the laser. These scribes are spaced on a 40 um pitch and are continuous across the backside of the laser.

FIG. 21 are digital images of scribe regions for laser devices according to embodiments of the invention. As shown, the backside scribe is for a laser bar device including a plurality of laser devices. Depending upon the embodiment, multiple scribes can be used in a single or multiple laser devices. The scribe regions correspond to respective contact regions, e.g., n-type. As shown, the scribes are formed before metallization, but can also be formed after metallization in other examples. The scribe regions are configured from about 1 to about 30 microns, although there can be variations. Each of the scribe regions includes a gallium rich region to facilitate device performance. Each of the scribe regions has a width of 5 to 10 microns. The scribe regions are formed using a UV laser configured with a 355 nm source and an output power of 30 to 300 milli-Watts, but can be others. The laser is pulsed having a pulse time in a nano-second regime, e.g., 2-100. The laser device and beam ablates a portion of the gallium and nitrogen containing material causing formation of the gallium rich region, and a metal nucleation region, which may be removed later.

FIG. 22 is an image of scribe regions configured in a ladder pattern. As shown, the backside scribe is for a laser bar device including a plurality of laser devices. Depending upon the embodiment, multiple scribes can be used in a single or multiple laser devices. The scribe regions correspond to respective contact regions, e.g., n-type. The scribes are formed before metallization, but can also be formed after metallization. The scribe regions are configured from about 1 to about 30 microns. Each of the scribe regions includes a gallium rich region to facilitate device performance and a width of 5 to 10 microns. The scribe regions are formed using a UV laser configured with a 355 nm source and an output power of 30 to 300 milli-Watts. The laser is pulsed having a pulse time in a nano-second regime, e.g., 2-100. The laser device and beam ablates a portion of the gallium and nitrogen containing material causing formation of the gallium rich region, and a metal nucleation region, which may be removed later.

FIG. 23 is an image of scribe regions configured in a ladder pattern. As shown, the scribe regions are configured in respective contact regions of LED devices, such as those shown in a previous Figure. As shown, each of the contact regions is formed in a circular manner. Two scribe regions are formed on each contact region. The two scribe regions are separated by a gap, which is larger than half the diameter of the contact region. Multiple scribes can be used in a single or multiple LED devices or multiple pads can be used for a single LED device. The scribe regions correspond to respective contact regions, e.g., n-type. As shown, the scribes are formed after metallization, but can also be formed before metallization in other examples. The scribe regions are configured from about 1 to about 30 microns. Each of the scribe regions includes a gallium rich region to facilitate device performance. Each of the scribe regions has a width of 5 to 10 microns and a length along an entirety of contact region. The scribe regions are formed using a UV laser configured with a 355 nm source and an output power of 30 to 300 milli-Watts, but can be others. The laser is pulsed having a pulse time in a nano-second regime, e.g., 2-100. The laser device and beam ablates a portion of the gallium and nitrogen containing material, along with a portion of the overlying metallization, causing formation of the gallium rich region, metal alloy, and a metal nucleation region, which may be removed later.

FIG. 24 is a contact IV curve (1) with a scribe region; (2) without a scribe region an embodiment of the invention. As shown on the left hand side plot, the horizontal axis is current (I) and the vertical axis is voltage. The single scribe or double scribe is shown by the substantially horizontal line (see also square and triangle reference objects), which represents an ohmic-contact. In contrast, the s-shaped curve illustrates a non-ohmic or Shottky contact, which is undesirable, without the scribe regions. As shown in the right hand side plot, the single and double scribed embodiments are shown under a magnified voltage scale ranging from about −0.8 Volt to about +0.8 Volts, which clearly demonstrates the benefit of lower contact resistance according to the present embodiments.

FIGS. 25 and 26 illustrate experimental results of multiple scribe regions according to the invention as applied to resistance. As shown, n-type contacts regions have been deposited on top and bottom on two 300 um thick n-type GaN substrates. One of the substrates had a doping level of ~1.5E17 cm-3 and the second substrate had a doping level of ~7.5E17 cm-3. In this example, voltage versus current and series resistance measurements have been made on top side pads with various numbers of laser scribes. As shown, we observed a reduced voltage and reduced resistance with increased number of laser scribes, which was unexpected.

The method provides laser diodes operating in the 390-540 nm range, and even above that. The laser diodes can have the following parameters:
 Operating Current density range: 0.5-16 kA/cm2 and above;
 Operating Voltage range: 4-9V and above;
 Series resistance range: 1-15 ohms and above; and
 Operating output power range: 0.5-5 W and above.

In alternative embodiments, the laser diodes may include single lateral mode, multi-lateral mode, laser arrays for high power, edge emitting, vertical cavity (VCSEL), as well as combinations of these.

In alternative embodiments, the present method and device are configured for LEDS operating in the 390-540 nm range and above, with the following parameters:
 Operating Current density range: 0.1-2.0 kA/cm2 and above;
 Operating Voltage range (per single LED): 2.2-6.0V and above;
 Operating Voltage range (for series connected LEDs): 4-140V and above;
 Series resistance range: 0.1-10 ohm and above; and
 Operating output power range: 200 mW-10 W and above.

The present method and device provides for improved contacts formed by a combination of localized, high temperature annealing and intermixing between the contact metal and the GaN to form a lower resistance alloy. The high local annealing temperature is capable of creating thin dielectric layers such as TiN from a Ti metal layer, or AlN from an Al metal layer, through which is easier to tunnel through to more effectively inject electrons into the GaN substrate. The choice of metal is important for the optical performance of the LEDs, with metal such as Al, forming an AlN injection layer preferred in the LED case. In other embodiments, the scribe process through the metal contact forms "recast" layers on the top surface and on the sides of the scribes. Part of the recast is elemental gallium, which reacts with Au and oxygen at room temp over longer time or faster at higher temperatures. Control of the amount of recast, and interaction of this elements with subsequent process including thermal cycles and cleaning chemicals helps prevent failure of wire bonds during assembly or reliability stress.

The method and structure also includes a cleaning process. The cleaning of the scribes occurs with, for example, hot DI water to remove most of the elemental Ga, which prevents degradation effects described above. The contact resistance per unit area increases by 25% ohmic with the cleaning process. It is believed this is due to removal of a conductive metal layer that allows access to a larger injection surface.

In an alternative embodiment, the scribe regions on the contacts in the presence of a thin Al layer form the contact, while cleaning of the elemental gallium metal product of the scribe process prevent reliability issues. Deposition of a thicker metal layer for conductivity and wire bonding can then be provided. The deposition of this final metal layer can be accomplished by sputtering, evaporation, either by lift-off or etch back, or electroplating utilizing the substrate to bias all the n-pads and only electroplate where Al is present.

While the above is a full description of the specific embodiments, various modifications, alternative constructions and equivalents may be used. Therefore, the above description and illustrations should not be taken as limiting the scope of the invention which is defined by the appended claims.

What is claimed is:

1. An optical device comprising:
 a gallium and nitrogen containing substrate having a crystalline surface region and a backside opposite the crystalline surface region;
 at least one ablated region characterized by a v-shaped profile or a trench-shaped profile on the backside of the gallium and nitrogen containing substrate, where sides and a bottom of the at least one ablated region are gallium rich and have a higher gallium concentration than a surface of the backside of the gallium and nitrogen containing substrate that is laterally spaced from the at least one ablated region; and
 a metal contact contacting the backside of the gallium and nitrogen containing substrate and covering at least a portion of the at least one ablated region to form a contact region.

2. The device of claim 1 further comprising a laser stripe region overlying at least a portion of the crystalline surface region.

3. The device of claim 2, wherein the at least one ablated region is aligned with the laser stripe region.

4. The device of claim 1 wherein the metal contact is an n-type metal contact.

5. The device of claim 1 further comprising an n-type gallium nitride region overlying the crystalline surface region, an active region overlying the n-type gallium nitride region, and a laser stripe region overlying the active region.

6. The device of claim 5 wherein the active region includes one to twenty quantum well regions, the active region characterized by a thickness of 10 Angstroms to about 100 Angstroms.

7. The device of claim 1 wherein the at least one ablated region corresponds to the contact region.

8. The device of claim 1, wherein the at least one ablated region is characterized by a depth from 15 μm to 20 μm and a width from 0.5 μm to 50μm.

9. The device of claim 1, wherein the at least one ablated region comprises an elemental gallium region.

10. The device of claim 1, wherein the at least one ablated region is formed using a laser.

11. The device of claim 10, wherein the laser is a UV laser.

12. The device of claim 11, wherein the laser is characterized by a power of 30 mW to 300 mW.

13. The device of claim 11, wherein the laser is characterized by a power from 10 mW to 50 mW.

14. The device of claim 1, comprising a laser ridge, wherein the at least one ablated region is parallel to the laser ridge.

15. The device of claim 1, wherein the at least one ablated region is characterized by a depth from 3 μm to 60 μm.

16. The device of claim 1, wherein the at least one ablated region comprises a plurality of parallel ablated regions.

17. The device of claim 1, wherein the metal contact overlies the at least one ablated region.

18. The device of claim 1, wherein the at least one ablated region penetrates into a portion of the gallium and nitrogen containing substrate.

19. The device of claim 1, wherein the metal contact comprises a material selected from aluminum, nickel, gold, titanium, platinum, silicon, and a combination of any of the foregoing.

20. The device of claim 1, wherein the at least one ablated region is characterized by a length from 50 μm to 3,000 μm.

21. The device of claim 1, wherein the metal contact is ohmic.

* * * * *